US012712158B2

(12) United States Patent
Chen et al.

(10) Patent No.: US 12,712,158 B2
(45) Date of Patent: Aug. 18, 2026

(54) METHOD FOR FORMING SEMICONDUCTOR DEVICE STRUCTURE

(71) Applicant: Taiwan Semiconductor Manufacturing Company, Ltd., Hsinchu (TW)

(72) Inventors: Po-Ju Chen, Hsinchu City (TW); Chun-Hsing Wu, Zhubei City (TW); Fang-Yi Wu, Kaohsiung City (TW); Yi-Wei Chiu, Kaohsiung City (TW); Chih-Hao Chen, Hsinchu City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/868,870

(22) Filed: Jul. 20, 2022

(65) Prior Publication Data

US 2022/0351946 A1 Nov. 3, 2022

Related U.S. Application Data

(62) Division of application No. 16/104,564, filed on Aug. 17, 2018, now abandoned.

(Continued)

(51) Int. Cl.

*H10P 50/24* (2026.01)
*H01J 37/32* (2006.01)

(Continued)

(52) U.S. Cl.

CPC .. *H01J 37/32568* (2013.01); *H01J 37/32183* (2013.01); *H01J 37/32541* (2013.01);

(Continued)

(58) Field of Classification Search

None

See application file for complete search history.

(56) References Cited

U.S. PATENT DOCUMENTS 4,885,074 A * 12/1989 Susko .............. H01J 37/32541 204/298.31
5,286,297 A 2/1994 Moslehi et al.

(Continued)

FOREIGN PATENT DOCUMENTS

JP 57023227 A 2/1982
JP 6324623 A 2/1988

(Continued)

OTHER PUBLICATIONS

KR20060044089a, Kim Pyung Ho, Plasma Etch Apparatus Having Height-Adjustable and segmented anode electrodes and etching method using the apparatus, May 2006, abstract. (Year: 2006).*

(Continued)

*Primary Examiner* — Sylvia Macarthur
*Assistant Examiner* — Michelle Crowell
(74) *Attorney, Agent, or Firm* — Birch, Stewart, Kolasch & Birch, LLP

(57) ABSTRACT

A method for forming a semiconductor device structure is provided. The method includes placing a substrate including a material layer thereon in a plasma chamber. The plasma chamber includes a housing, a first electrode array including a plurality of first sub-electrodes, a plurality of first matching units each electrically connected to one of the first sub-electrodes, and a second electrode array disposed in the housing, the second electrode array including a plurality of second sub-electrodes. The method also includes supplying an etching gas into the plasma chamber and applying a first RF power source to the first sub-electrodes of the first electrode array by the first matching units to form an etching plasma from the etching gas. The method further includes (Continued)

adjusting a distance between each of the first sub-electrodes and the substrate to generate a plasma density distribution across the substrate.

20 Claims, 18 Drawing Sheets

Related U.S. Application Data

(60) Provisional application No. 62/587,751, filed on Nov. 17, 2017.

(51) Int. Cl.
*H10P 50/28* (2026.01)
*H10P 72/00* (2026.01)
*H10P 72/72* (2026.01)
*H10W 20/00* (2026.01)
*H10D 30/01* (2025.01)

(52) U.S. Cl.
CPC .... *H01J 37/3255* (2013.01); *H01J 37/32715* (2013.01); *H10P 50/242* (2026.01); *H10P 50/283* (2026.01); *H10P 72/0421* (2026.01); *H10P 72/0432* (2026.01); *H10P 72/722* (2026.01); *H10W 20/01* (2026.01); *H01J 2237/334* (2013.01); *H10D 30/024* (2025.01); *H10P 72/72* (2026.01)

(56) References Cited

U.S. PATENT DOCUMENTS 5,434,353 A * 7/1995 Kraus ...................... H05H 1/18 174/99 R
5,522,934 A * 6/1996 Suzuki .................. C23C 16/455 118/723 MR
5,571,366 A * 11/1996 Ishii .................... H01J 37/3299 216/60
5,609,690 A * 3/1997 Watanabe ......... H01J 37/32165 118/723 ER
5,716,451 A 2/1998 Hama et al.
5,907,221 A 5/1999 Sato et al.
5,916,820 A * 6/1999 Okumura .......... H01J 37/32082 257/E21.279
5,948,215 A * 9/1999 Lantsman ............. H01J 37/321 204/192.12
6,024,827 A * 2/2000 Ishii .................... H01J 37/3244 156/345.48
6,042,686 A 3/2000 Dible et al.
8,138,444 B2 * 3/2012 Kim .................. H01L 21/67265 219/121.36
8,547,021 B2 10/2013 Wei
2002/0092618 A1 7/2002 Collins
2002/0125213 A1 9/2002 Yamazaki et al.
2003/0052085 A1 3/2003 Parsons
2003/0121886 A1 7/2003 Strang et al.
2006/0213864 A1 9/2006 Tahara et al.
2006/0254518 A1 11/2006 Ellingboe
2006/0254717 A1* 11/2006 Kobayashi ........ H01L 21/02087 156/345.44
2007/0029194 A1 2/2007 Matsumoto et al.
2007/0199658 A1* 8/2007 Dhindsa ............ H01J 37/32642 156/345.43
2007/0221622 A1 9/2007 Kim
2008/0110859 A1 5/2008 Koshiishi et al.
2008/0119049 A1 5/2008 Sung et al.
2008/0314408 A1* 12/2008 Jeong ................ H01J 37/32165 134/1.1
2009/0102385 A1* 4/2009 Wi .................... H01J 37/32091 315/111.21
2010/0080933 A1* 4/2010 Kudela ............... C23C 16/5096 427/574
2010/0130018 A1 5/2010 Tokashiki et al.
2010/0283108 A1* 11/2010 Sawada ............. H01L 21/02222 257/E27.06
2011/0146703 A1* 6/2011 Chen ..................... C23C 16/509 134/1.1
2011/0253672 A1 10/2011 Kamibayashi et al.
2012/0299081 A1* 11/2012 Lee ........................ H10B 41/30 257/E21.209
2013/0126475 A1 5/2013 Dhindsa et al.
2013/0134877 A1* 5/2013 Kim ......................... H05H 1/46 315/111.21
2013/0295774 A1* 11/2013 Shimizu ............ H01J 37/32568 438/715
2014/0008020 A1* 1/2014 Nagayama ........ H01J 37/32091 137/2
2014/0069585 A1* 3/2014 Aoto ................. H01J 37/32807 156/345.52
2014/0139049 A1 5/2014 Fischer et al.
2014/0144876 A1 5/2014 Nakagawa et al.
2015/0179259 A1* 6/2015 Kim .................. H01L 21/76229 711/125
2015/0228461 A1 8/2015 Fukazawa et al.
2015/0380318 A1* 12/2015 Ng .................. H01L 21/823885 438/270
2016/0027619 A1* 1/2016 Sato ........................ C23C 16/50 118/723 R
2018/0019102 A1* 1/2018 Voronin ............ H01J 37/32082
2018/0047821 A1* 2/2018 Iwasaki ............. H01L 29/42376
2019/0088521 A1* 3/2019 Chua ................. H01L 21/68742
2019/0148119 A1* 5/2019 Sung ................... H01L 21/6833 156/345.48

FOREIGN PATENT DOCUMENTS

JP 7201822 A 8/1995
JP 8227880 A 9/1996
JP 2008027816 A 2/2008
JP 2008177194 A 7/2008

OTHER PUBLICATIONS

CN-101903971-A, Bellinger A, Method for Manufacturing Large-area Vacuum Plasma treated substrates and vacuum plasma treatment apparatus, Dec. 2010, abstract. (Year: 2010).*

* cited by examiner

METHOD FOR FORMING SEMICONDUCTOR DEVICE STRUCTURE

CROSS REFERENCE TO RELATED APPLICATIONS

This application is a Divisional Application of U.S. patent application Ser. No. 16/104,564, filed on Aug. 17, 2018, and entitled “Plasma processing apparatus and method for forming semiconductor device structure”, which claims the benefit of U.S. Provisional Application No. 62/587,751, filed on Nov. 17, 2017, and entitled “Plasma processing apparatus and method for forming semiconductor device structure”, the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

A plasma processing (dry etching) process offers better critical dimension control than conventional wet chemical etching in the fabrication of semiconductor devices.

Although existing plasma processing apparatuses have generally been adequate for their intended purpose, they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
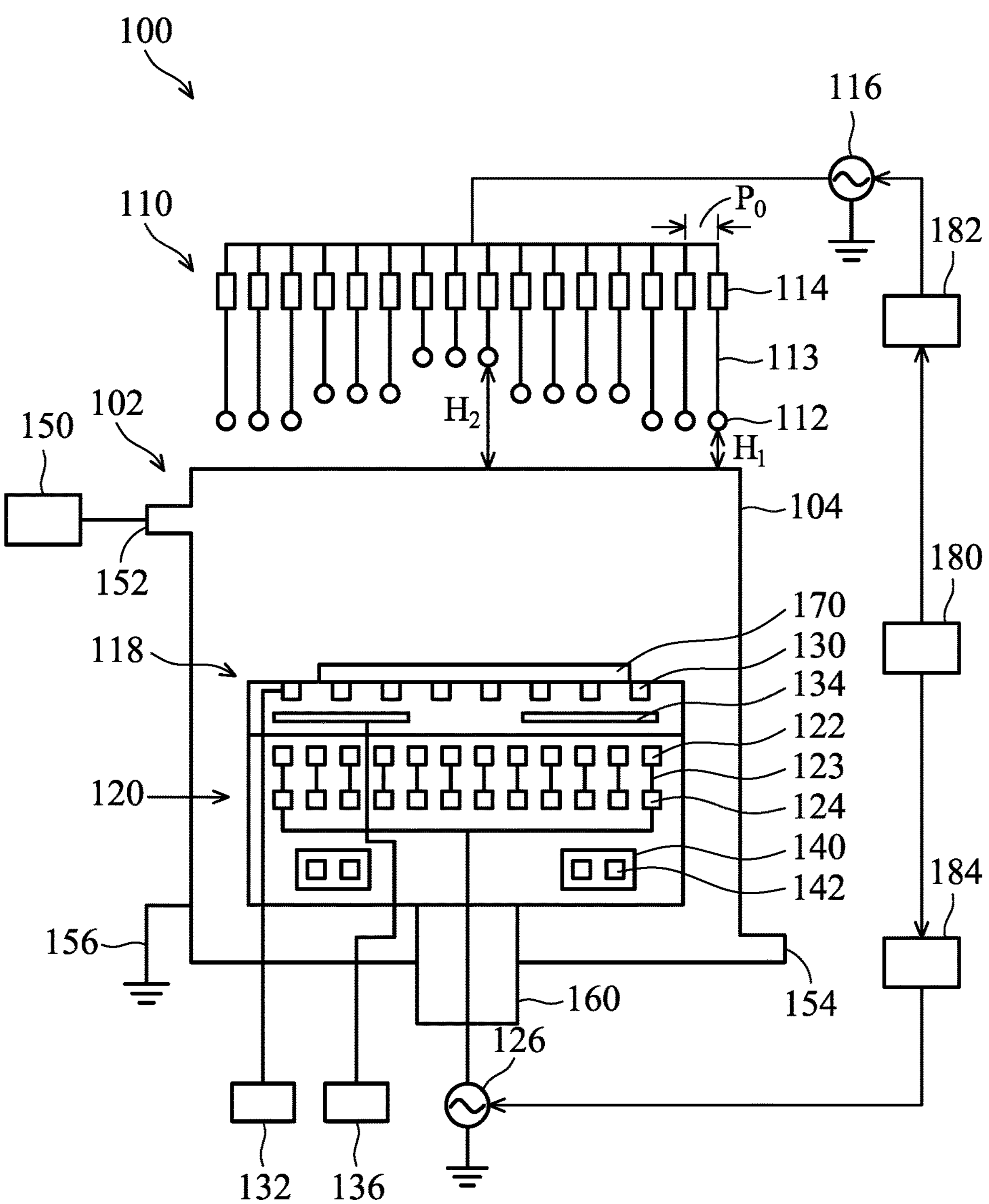
FIG. 1 shows a schematic view of a plasma processing apparatus, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-alignment process. The sacrificial layer is then removed, and the remaining spacers may then be used to pattern the fins.

Embodiments for a plasma processing apparatus are provided. FIG. 1 shows a schematic view of a plasma processing apparatus 100, in accordance with some embodiments of the disclosure. The plasma processing apparatus 100 includes a plasma chamber 102, a first electrode array 110 (or top electrode array) and a second electrode array 120 (or bottom electrode array). The plasma chamber 102 includes a housing 104 (or wall portions). The housing 104 is configured to maintain a vacuum environment during processing. The housing 104 is grounded through a ground 156.

The housing 104 includes a gas inlet 152 and a gas outlet 154. The gas inlet 152 is connected to the plasma chamber 102. A gas supply 150 is coupled to the plasma chamber 102. The gas from the gas supply 150 is supplied to the plasma chamber 102 through the gas inlet 152. The gas supply 150 may supply a single gas or a gas mixture of more than one gas. The gas outlet 154 is connected to the plasma chamber 102. The chemical byproducts and unwanted reagents from the plasma chamber 102 are evacuated via gas outlet 154.

The first electrode array 110 is disposed above and outside the housing 104. The first electrode array 110 includes a number of first sub-electrodes 112 (or top sub-electrodes). In some embodiments, the first sub-electrodes 112 are made of low-resistivity material. In some embodiments, the first sub-electrodes 112 are made of conductive materials, such as aluminum (Al), nickel (Ni), chromium (Cr), tin (Sn), copper (Cu), platinum (Pt), gold (Au), ceramic or piezoelectric material.

A number of first matching units 114 are outside the housing 104. The first matching units 114 are used to perform an impedance matching function. Each of the first matching units 114 are electrically connected to corresponding first sub-electrodes 112 by a number of first conductive lines 113. The first conductive lines 113 may have different lengths. Therefore, the first sub-electrodes 112 have different heights $H_1$, $H_2$. The heights $H_1$, $H_2$ is measured from the top surface of the housing 104 to the bottom surface of each of the first sub-electrodes 112. The plasma density in the plasma chamber 102 can be controlled by adjusting the height $H_1$, $H_2$ of each of the first sub-electrodes 112. In some embodiments, a first portion of the first sub-electrodes 112 in the edge region of the first electrode array 110 has a first height $H_1$, and a second portion of the first sub-electrodes 112 in the middle region of the first electrode array 110 has a second height $H_2$. The second height $H_2$ is greater than the first height $H_1$. When the first portion of the first sub-electrodes 112 is closer to the housing 104 than the second portion of the first sub-electrodes 112, a first plasma density of a first region which is directly below the first portion of the first sub-electrodes 112 will be higher than a second plasma density of a second region which is directly below the second portion of the first sub-electrodes 112. In some embodiments, the first height $H_1$ is in a range from about 0.1 cm to about 20 cm. There is a pitch $P_0$ between two adjacent first sub-electrodes 112. In some embodiments, the pitch $P_0$ is in a range from about 0.05 mm to about 10 mm.

A first RF power source 116 is electrically connected to the number of the first matching units 114. The first RF power source 116 is configured to provide a RF power (or RF energy) to each of the first sub-electrodes 112 via each of the first matching units 114. The first RF power source 116 is configured to supply an RF power for plasma generation to the first sub-electrodes 112 through the first matching units 114. The first matching units 114 are disposed on the transmission path between the first RF power source 116 and the first sub-electrodes 112, and the first matching units 114 are configured to perform an impedance matching function. More specifically, through the help of the number of the first matching units 114, the first RF power source 116 can provide different levels of RF power to the first sub-electrodes 112 to form a desired plasma density distribution in the different regions of the plasma chamber 102.

The first sub-electrodes 112 are separately controlled by a number of first matching units 114. In some embodiments, the first RF power generated from the first RF power source 116 applies a high-frequency in a range from about 1 MHz to about 100 MHz.

A wafer support 118 is disposed in the plasma chamber 102. The wafer support 118 is configured to support a wafer or substrate 170. The second electrode array 120 (or bottom electrode array) is disposed in the wafer support 118 in the plasma chamber 102. A number of gas channels 130 are disposed in the wafer support 118. The gas channels 130 are connected to a gas supply 132. The gas channels 130 are configured to transfer the heat to provide uniform temperature distribution. The heat may be generated from the electrostatic electrode 134 or from the etching process. An electrostatic electrode 134 is disposed in the wafer support 118 and is configured to hold the substrate 170 by an electrostatic attracting force. The electrostatic electrode 134 is connected to a chuck power 136.

The second electrode array 120 includes a number of second sub-electrodes 122 (or bottom sub-electrodes). A number of second matching units 124 are electrically connected to corresponding the second sub-electrodes 122. Each of the second matching units 124 are electrically connected to corresponding second sub-electrodes 122 by a number of second conductive lines 123. In some embodiments, the second sub-electrodes 122 are made of low-resistivity material. In some embodiments, the second sub-electrodes 122 are made of conductive materials, such as aluminum (Al), nickel (Ni), chromium (Cr), tin (Sn), copper (Cu), platinum (Pt), gold (Au), ceramic or piezoelectric material.

A second RF power source 126 is disposed outside the housing 104 and the plasma chamber 102. The second RF power source 126 is configured to provide a RF power (or RF energy) to each of the second sub-electrodes 122 via each of the second matching units 124. More specifically, the second RF power source 126 is configured to provide different RF powers to the second sub-electrodes 122 through the number of the second matching units 124 to form a desired plasma density distribution in the different regions of the plasma chamber 102. The second sub-electrodes 122 are separately controlled by a number of second matching units 124.

A cooling plate 140 is disposed in the wafer support 118 to form a built-in cooling mechanism, and a cooling fluid 142 are disposed in the cooling plate 140. The cooling plate 140 is configured to cool the temperature of the substrate 170. A moving mechanism 160 is below the wafer support 118 and enables the wafer support 118 assembly to move up or down.

A controller 180 is coupled to the plasma chamber 102. The controller 180 sets the operational parameters of the plasma chamber 102, including which RF power sources are turned on or turned off, their voltages and power settings. The controller 180 is coupled to a first power controller 182 and a second power controller 184. The first power controller 182 provides the control signals to the first RF generator 116 to control the amount of power from the first RF generator 116. The second power controller 184 provides the control signals to the second RF generator 126 to control the amount of power from the second RF generator 126. In some embodiments, the controller 180 sends instructions to the first power controller 182 for the configuration of the power on the first sub-electrodes 112, which includes setting switch to connect the first sub-electrodes 112 to ground or to RF power. In some other embodiments, the controller 180 sends instructions to the first power controller 182 and the second power controller 184, which includes switching to connect the first sub-electrodes 112 to ground or to RF power, and switching to connect the second sub-electrodes 122 to ground or to RF power.

The plasma is generated between the top surface of the plasma chamber 102 and the wafer support 118. For example, the first sub-electrodes 112 are independently or separately powered by the first RF power source 116 through the number of the first matching units 114 to produce inductively coupled plasma (ICP) in the plasma chamber 102. In some embodiments, an electric field is generated by the first RF power source 116 to excite the reaction gas into the plasma chamber 102 while the etching gas or the cleaning gas is supplied into the plasma chamber 102 via the gas inlet 152. Afterwards, the reaction gas is excited into plasma by the electric field. After generation the plasma, the material layer 506 (shown in FIG. 5B) is etched by the plasma.

In some embodiments, the etching gas is supplied by the gas supply 150 into the plasma chamber 102. The etching gas includes fluorine-containing gas that includes nitrogen trifluoride ($NF_3$), hexafluoroethane ($C_2F_6$), tetrafluoromethane ($CF_4$), fluoroform ($CHF_3$), fluorine ($F_2$), hydrogen fluoride (HF), or a combination thereof. In some other embodiments, the etching gas further includes another additive gas, such as oxygen ($O_2$) or ozone ($O_3$).

In some embodiments, the cleaning gas is supplied by the gas supply 150 into the plasma chamber 102. The cleaning gas includes fluorine-containing gas, inert gas, or a combination thereof. The fluorine-containing gas includes nitrogen trifluoride ($NF_3$), hexafluoroethane ($C_2F_6$), tetrafluoromethane ($CF_4$), fluoroform ($CHF_3$), fluorine ($F_2$), hydrogen fluoride (HF), or a combination thereof. The inert gas includes argon (Ar), helium (He), neon (Ne), krypton (Kr), xenon (Xe), or a combination thereof.

Figure 2A:
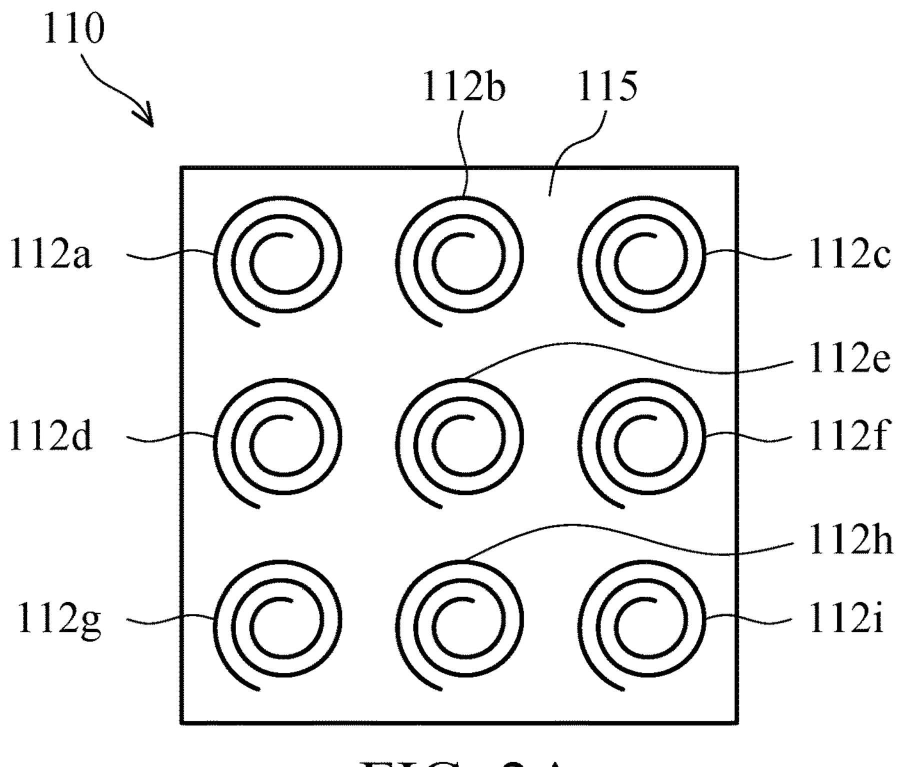
FIG. 2A shows a top-view of the first sub-electrodes, in accordance with some embodiments of the disclosure.
Figure 2A:
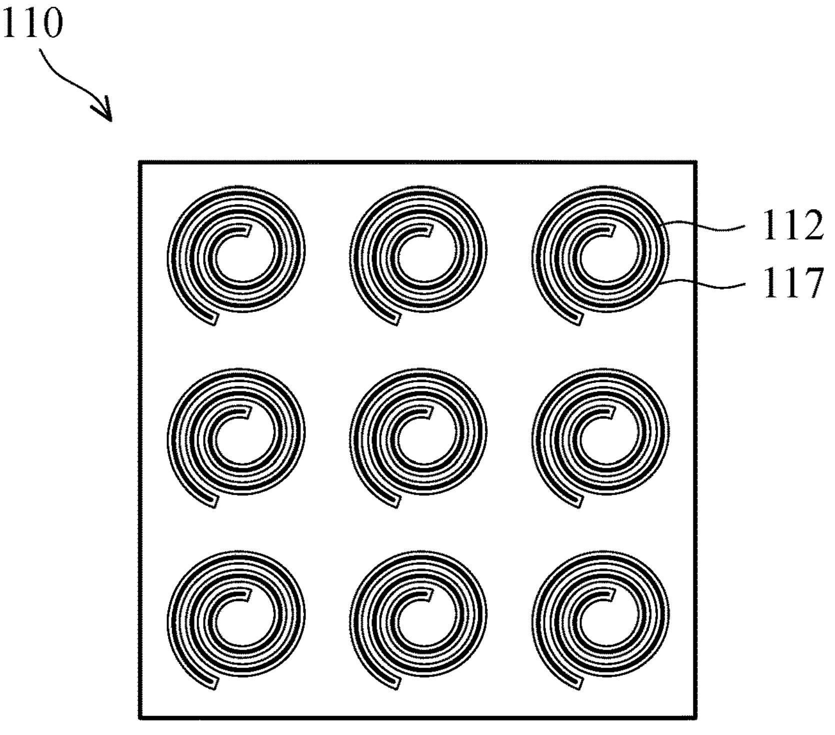

FIG. 2A shows a top-view of the first sub-electrodes 112, in accordance with some embodiments of the disclosure.

The first sub-electrodes 112 include a number of parts. In some embodiments, the first sub-electrodes 112 include a first part 112*a*, a second part 112*b*, a third part 112*c*, a fourth part 112*d*, a fifth part 112*e*, a sixth part 112*f*, a seventh part 112*g*, an eighth part 112*h* and a ninth part 112*i*. These parts 112*a*, 112*b*, 112*c*, 112*d*, 112*e*, 112*f*, 112*g*, 112*h*, 112*i* are separate from each other and arranged in a matrix. The first sub-electrodes 112 are separated from each other by a dielectric layer 115 between two adjacent first sub-electrodes 112. In some embodiments, each of the first sub-electrodes 112 has a spiral shape when seen from a top-view. In some embodiments, each of the parts of the first sub-electrodes 112 has a size in a range from about 0.1 $cm^2$ to about 1 $cm^2$.

FIG. 2A' shows a top-view of the first sub-electrodes 112, in accordance with some embodiments of the disclosure. FIG. 2A' is similar to FIG. 2A, the difference being that the adjacent sidewalls of the parts 112*a*, 112*b*, 112*c*, 112*d*, 112*e*, 112*f*, 112*g*, 112*h*, 112*i* of the first sub-electrodes 112 in FIG. 2A' are insulated by the insulating material 117.

Figure 2B:
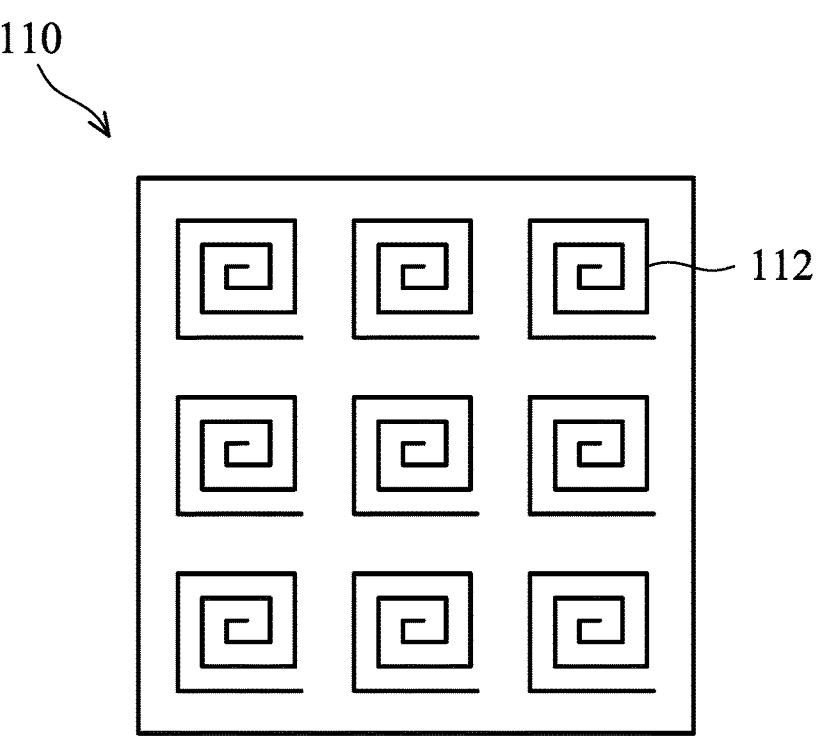
FIGS. 2B and 2B' show top-views of the first sub-electrodes in accordance with some embodiments of the disclosure.
Figure 2B:
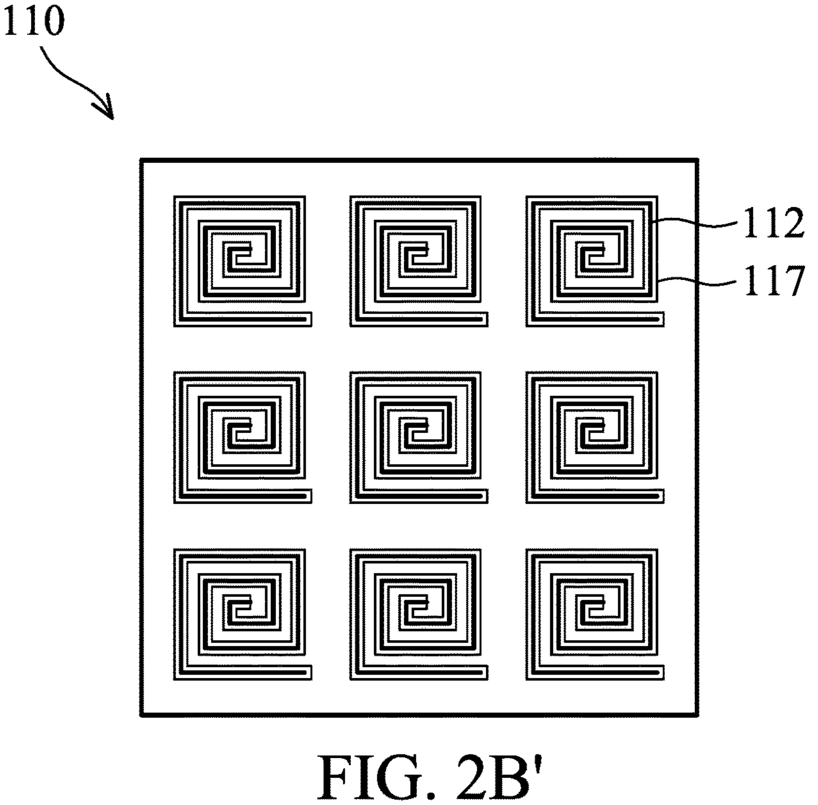

FIGS. 2B and 2B' show top-views of the first sub-electrodes 112 in accordance with some embodiments of the disclosure. Each of the first sub-electrodes 112 has a squared spiral shape when seen from a top-view. FIG. 2B' is similar to FIG. 2B, with the difference between them being the insulating material 117 that covers the outer surface of each of the first sub-electrodes 112.

Figure 2C:
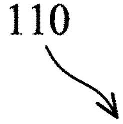
FIGS. 2C and 2C' show top-views of the first sub-electrodes, in accordance with some embodiments of the disclosure.
Figure 2C:
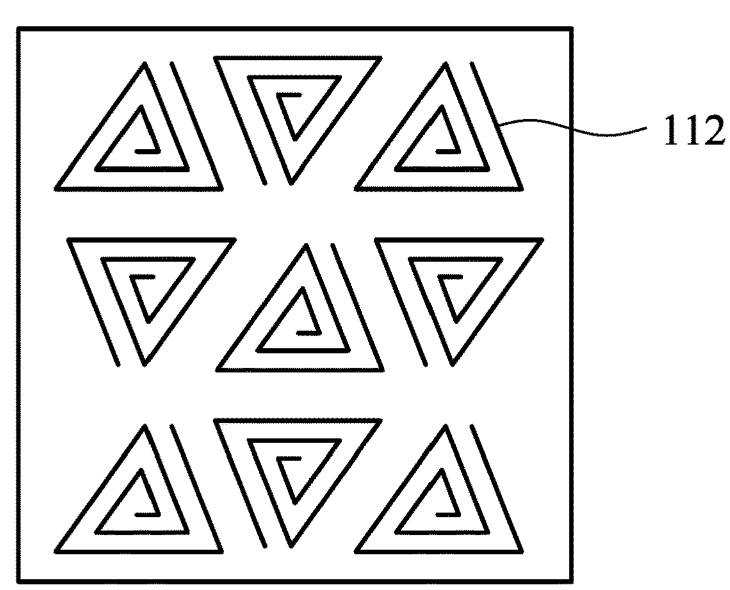
Figure 2C:
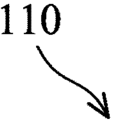
Figure 2C:
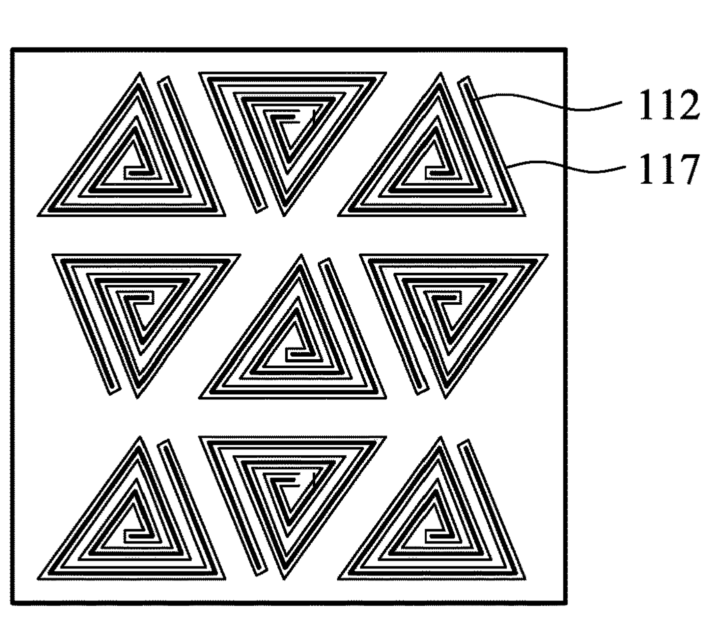

FIGS. 2C and 2C' show top-views of the first sub-electrodes 112, in accordance with some embodiments of the disclosure. Each of the first sub-electrodes 112 has a triangular spiral shape when seen from a top-view. FIG. 2C' is similar to FIG. 2C, the difference between them being that an insulating material 117 covers the outer surface of each of the first sub-electrodes 112.

Figure 2D:
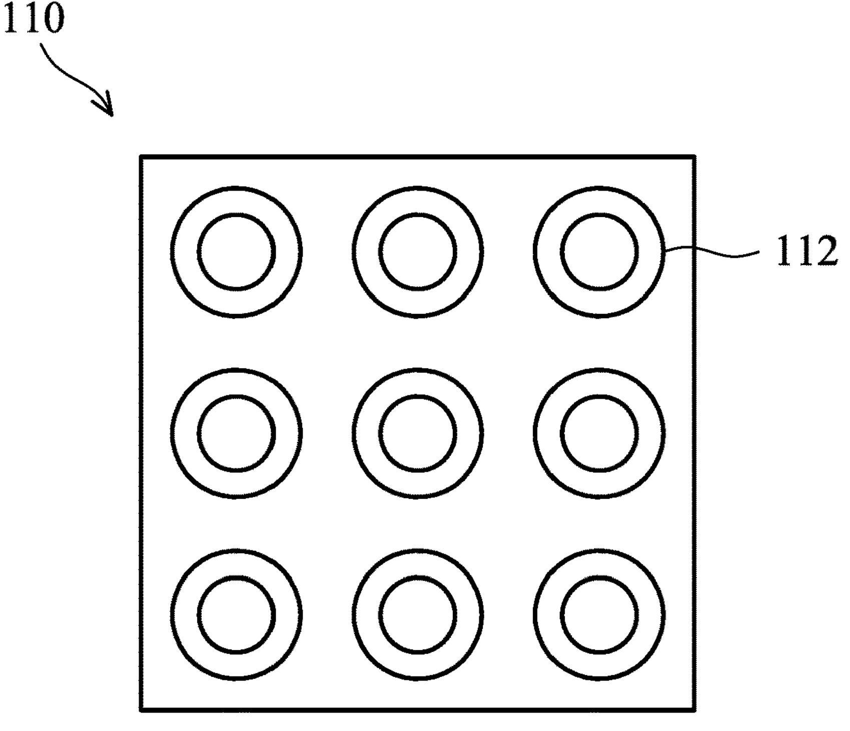
FIGS. 2D and 2D' show top-views of the first sub-electrodes, in accordance with some embodiments of the disclosure.
Figure 2D:
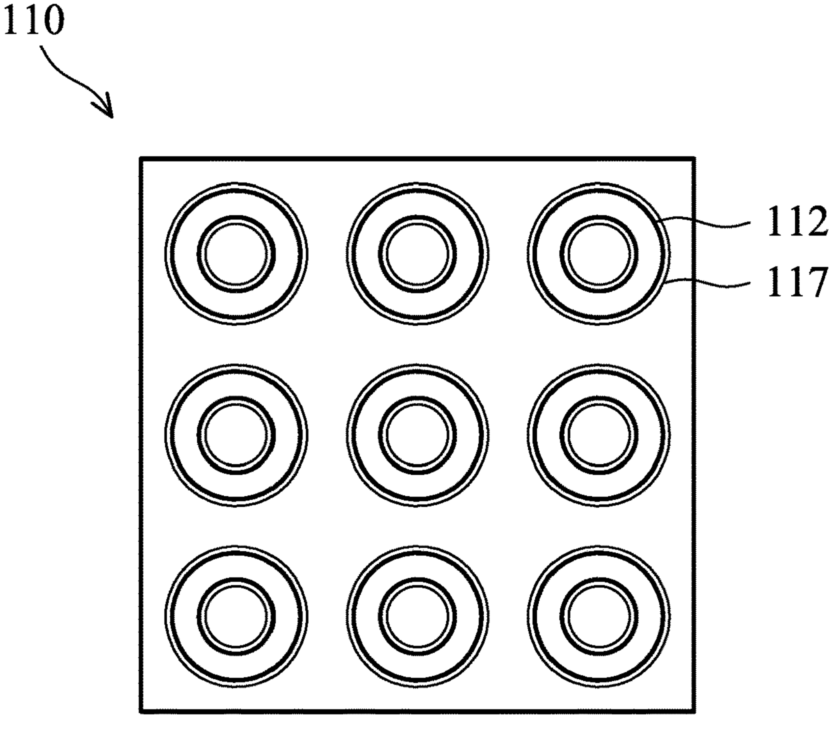

FIGS. 2D and 2D' show top-views of the first sub-electrodes 112, in accordance with some embodiments of the disclosure. Each of the first sub-electrodes 112 has a concentric ring shape when seen from a top-view. FIG. 2D' is similar to FIG. 2D, the difference between is that an insulating material 117 is covering the outer surface of each of the first sub-electrodes 112.

Figure 2E:
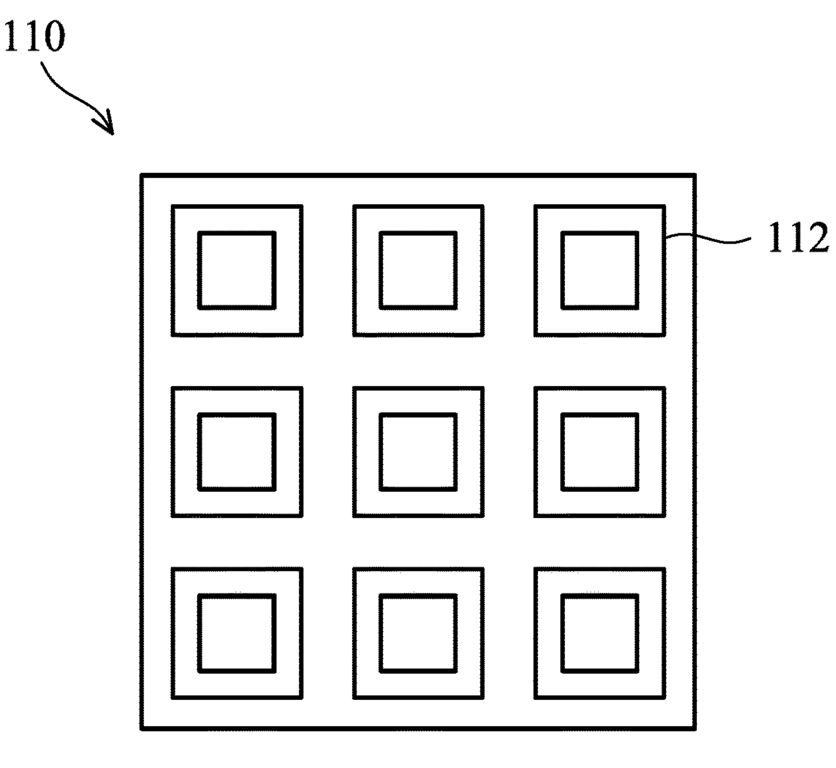
FIGS. 2E and 2E' show top-views of the first sub-electrodes, in accordance with some embodiments of the disclosure.
Figure 2E:
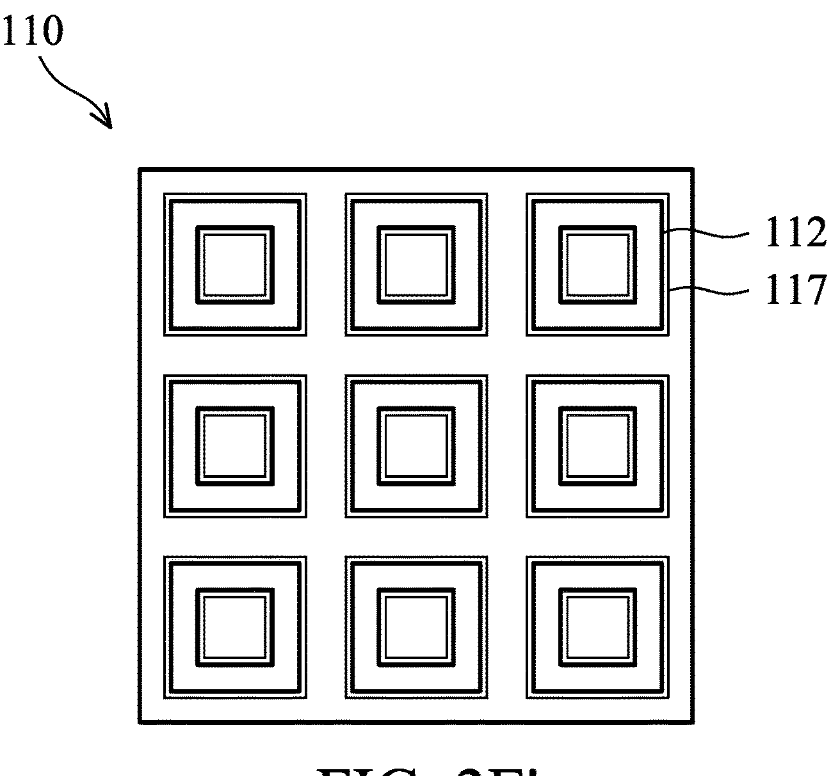

FIGS. 2E and 2E' show top-views of the first sub-electrodes 112, in accordance with some embodiments of the disclosure. Each of the first sub-electrodes 112 has a rectangular concentric shape when seen from a top-view. FIG. 2E' is similar to FIG. 2E, the difference between is that an insulating material 117 covers the outer surface of each of the first sub-electrodes 112.

Figure 2F:
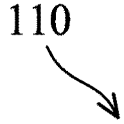
FIGS. 2F and 2F' show top-views of the first sub-electrodes, in accordance with some embodiments of the disclosure.
Figure 2F:
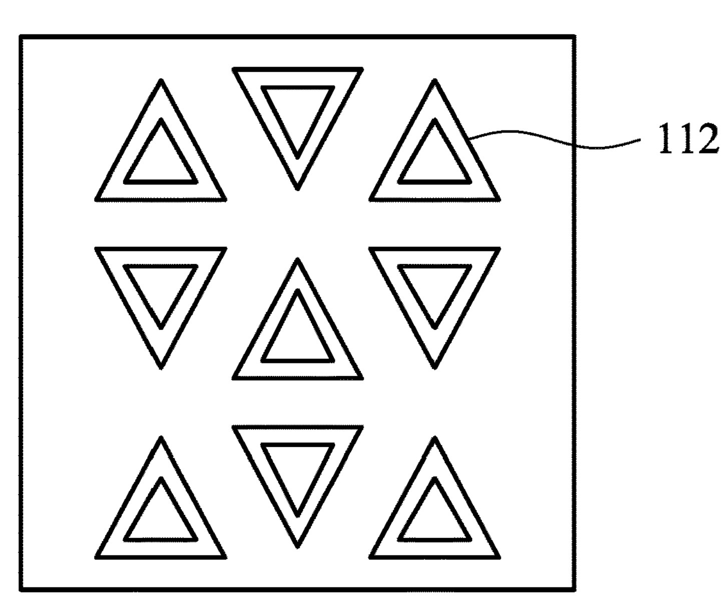
Figure 2F:
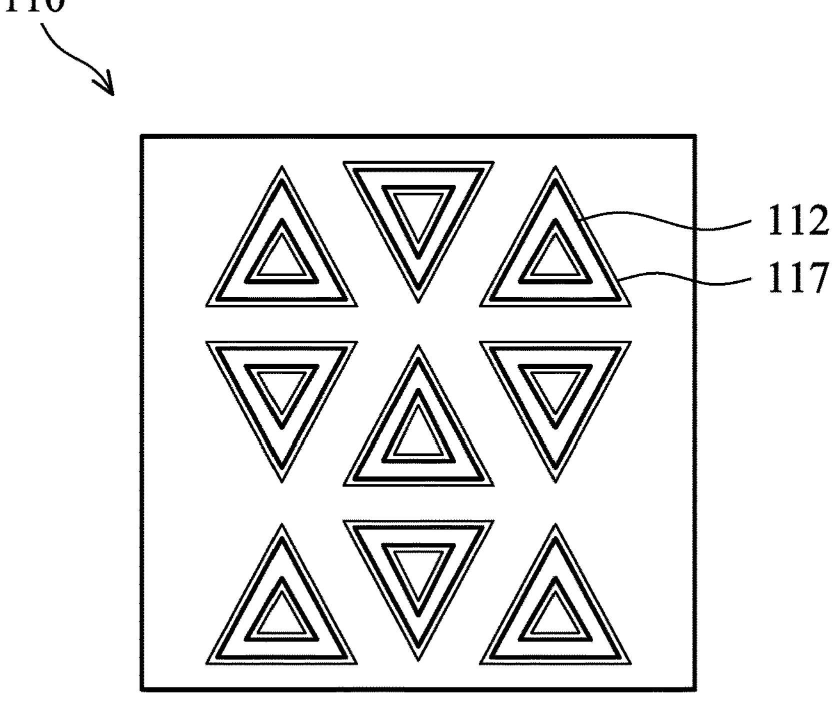

FIGS. 2F and 2F' show top-views of the first sub-electrodes 112, in accordance with some embodiments of the disclosure. Each of the first sub-electrodes 112 has a triangular concentric shape when seen from a top-view. FIG. 2F' is similar to FIG. 2F, the difference between them being that there is an insulating material 117 covering the outer surface of each of the first sub-electrodes 112.

It should be noted that the number of first sub-electrodes 112 is not limited to nine, and that the number of first sub-electrodes 112 can be adjusted according to actual application.

Figure 3A:
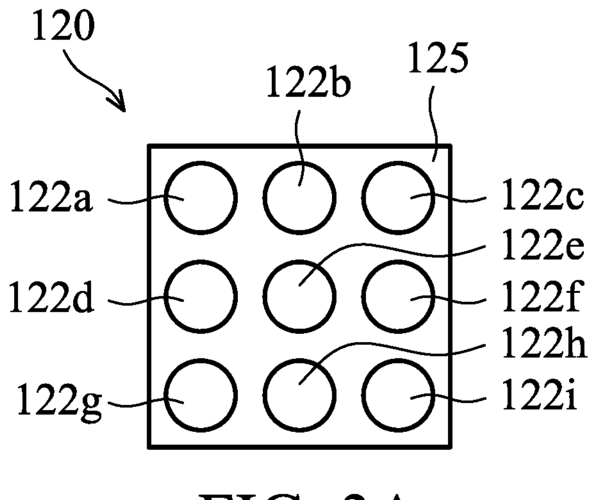
FIGS. 3A-3C shows top-views of the second sub-electrodes, in accordance with some embodiments of the disclosure.
Figure 3B:
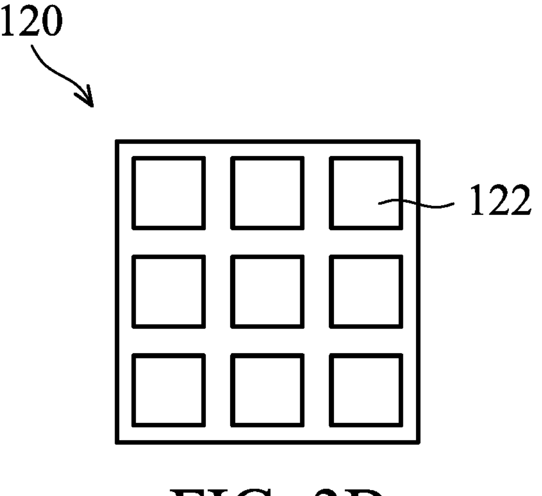
Figure 3C:
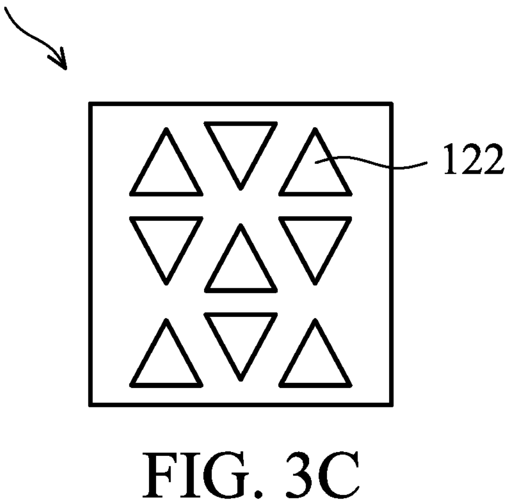

FIGS. 3A-3C show top-views of the second sub-electrodes 122, in accordance with some embodiments of the disclosure. The second sub-electrodes 122 include a number of parts. In some embodiments, the second sub-electrodes 122 include a first part 122*a*, a second part 122*b*, a third part 122*c*, a fourth part 122*d*, a fifth part 122*e*, a sixth part 122*f*, a seventh part 122*g*, an eighth part 122*h* and a ninth part 122*i*. These parts 122*a*, 122*b*, 122*c*, 122*d*, 122*e*, 122*f*, 122*g*, 122*h*, 122*i* are separate from each other and arranged in a matrix. The second sub-electrodes 122 are separated from each other by a dielectric layer 125 between two adjacent second sub-electrodes 122. In FIG. 3A, each of the second sub-electrodes 122 has a circular shape when seen from a top-view.

In FIG. 3B, each of the second sub-electrodes 122 has a rectangular shape when seen from a top-view. In FIG. 3C, each of the second sub-electrodes 122 has a triangular shape when seen from a top-view.

Figure 4:
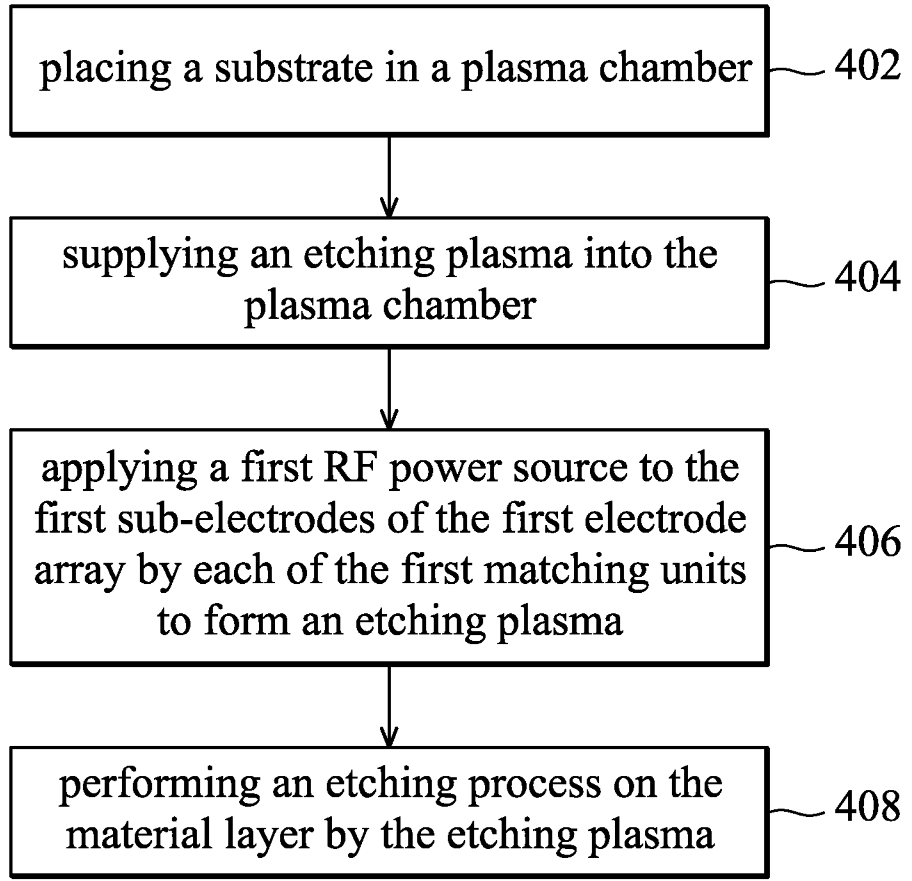
FIG. 4 shows a flow-chart of a method for forming a semiconductor device structure, in accordance with some embodiments.

FIG. 4 shows a flow-chart of a method for forming a semiconductor device structure, in accordance with some embodiments.

Figure 5A:
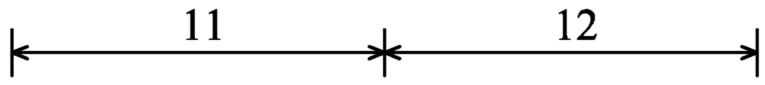
FIGS. 5A-5C show cross-sectional views of various stages of forming a semiconductor device structure, in accordance with some embodiments of the disclosure.
Figure 5A:
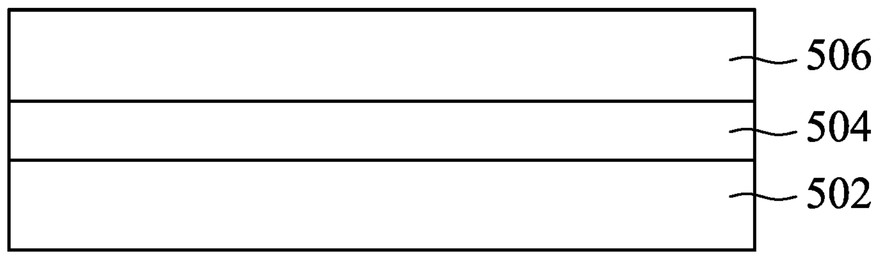

In operation 402, the substrate 170 as shown in FIG. 1 is placed in the plasma chamber 102. In some embodiments, a material layer 506 (as shown in FIG. 5A) is formed over the substrate 502.

In operation 404, an etching gas is supplied into the plasma chamber 102. In some embodiments, the etching gas includes fluorine-containing gas that includes nitrogen trifluoride ($NF_3$), hexafluoroethane ($C_2F_6$), tetrafluoromethane ($CF_4$), fluoroform ($CHF_3$), fluorine ($F_2$), hydrogen fluoride (HF), or a combination thereof. In some other embodiments, the etching gas further includes another additive gas, such as oxygen ($O_2$) or ozone ($O_3$).

In operation 406, a first RF power source 116 is applied to the first sub-electrodes 112 of the first electrode array 110 by each of the first matching units 114 to produce an etching plasma. Therefore, the process gas supplied in the plasma chamber 102 is excited and dissociated to form a plasma. In some embodiments, the etching plasma has different plasma densities in different regions above the substrate 170 or 502 by applying a different levels of RF power to every first sub-electrode 112. In some embodiments, the density of the plasma in the central region is increased by increasing the RF power of the corresponding first sub-electrode 112 in the central region.

In some other embodiments, a second RF power source 126 is applied to the second sub-electrodes 122 of the second electrode array 120. Therefore, an etchant or the etching plasma in the plasma chamber 102 is guided onto a surface of the substrate 170.

It should be noted that the first RF power source 116 and the second RF power source 126 are controlled separately to obtain stable plasma. The plasma in the housing 104 is controlled by the first RF power source 116, and the bombardment is controlled by the second RF power source 126. In some embodiments, only the first RF power source 116 is operated. For example, when a photoresist layer is removed, only the first RF power source 116 is operated. In some other embodiments, the first RF power source 116 and the second RF power source 126 are operated simultaneously using the controller 180. For example, when substrate 102 is made of silicon (Si), the first RF power source 116 and the second RF power source 126 are operated simultaneously in the etching process. The first RF power source 116 is used to remove the silicon material and the second RF power source 126 is used to remove the silicon oxide formed over the silicon.

In operation 408, an etching process is performed on the material layer 506 (shown in FIG. 5B) using the plasma. The etched depth of the material layer 506 is controlled by the plasma density of the plasma, and the plasma density is determined by separately controlling each of the first sub-electrodes 112 and/or the second sub-electrodes 122.

In some other embodiments, the first height $H_1$ of each of the first sub-electrodes 112 may be adjusted by adjusting the length of the first conductive lines 113. The first height $H_1$ is the distance between one of the first sub-electrodes 112 to the top surface of the plasma chamber 102. When one of the first sub-electrodes 112 is close to the plasma chamber 102, a higher electric field directly below the one of the first sub-electrodes 112 is generated to form a higher plasma density. The plasma densities in different regions of the plasma chamber 102 may be different by controlling the first height $H_1$.

Reference is now made to FIG. 1. In some instances, contamination of the substrate 170 is more prominent on edge region than on central region of the substrate 170. In those instances, a cleaning process can be performed on the edge region of the substrate 170. In some embodiments, a cleaning process is performed after the etching process. In some other embodiments, a cleaning process is performed between two etching processes. A cleaning gas is supplied into the plasma chamber 102. Afterwards, a cleaning process is performed on an edge region of the substrate 170 by applying the first RF power source 116 to a portion of the first sub-electrodes 112 which is located at an edge region of the first electrode array 110. In some other embodiments, a cleaning process is performed on an edge region of the substrate 170 by applying the first RF power source 116 to a portion of the first sub-electrodes 112 and simultaneously applying the second RF power source 126 to a portion of the second sub-electrodes 122. The portion of the first sub-electrodes 112 is configured to increase the plasma density near the edge region of the substrate.

It should be noted that the cleaning process is performed in-situ after the etching process without transferring the substrate 170 to another chamber. Therefore, the risk of the substrate pollution is reduced. Furthermore, the size of edge region of the first electrode array 110 may be tunable according to the size of the first sub-electrodes 112.

Figure 5B:
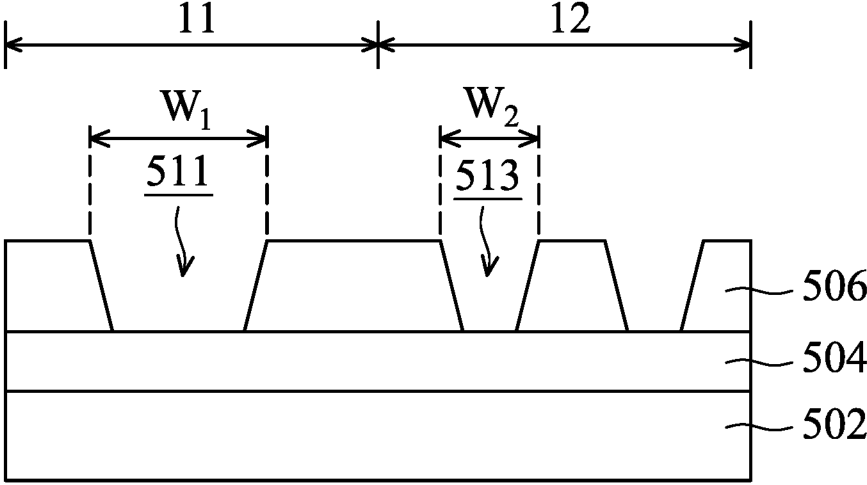
Figure 5C:
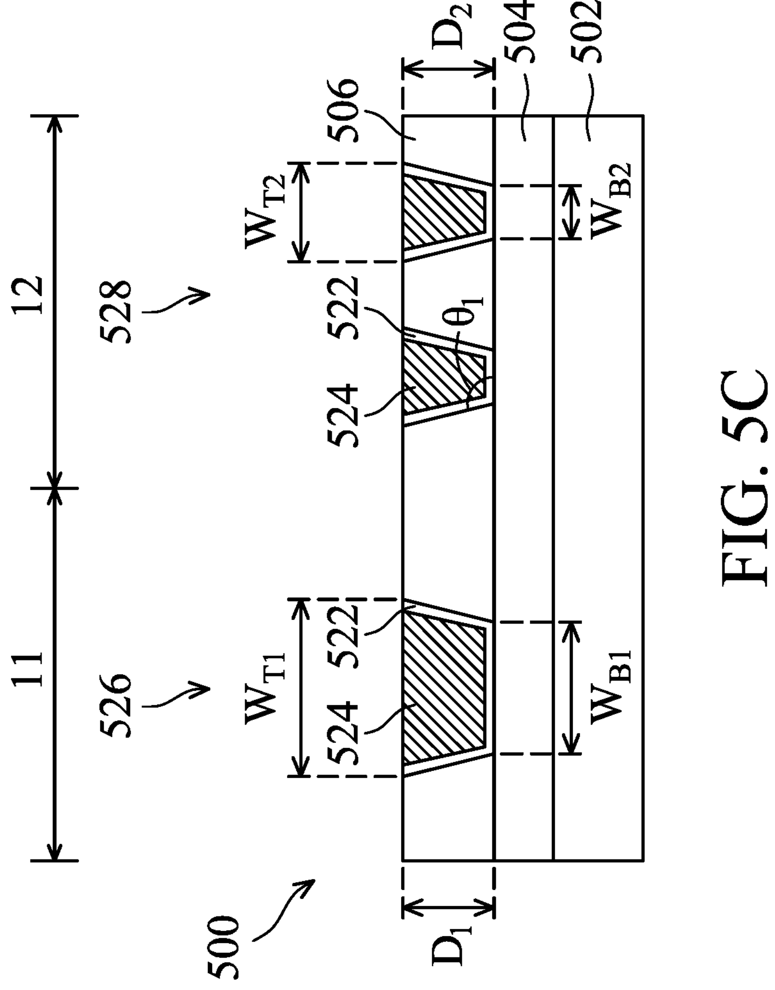

FIGS. 5A-5C show cross-sectional views of various stages of forming a semiconductor device structure 500, in accordance with some embodiments of the disclosure.

As shown in FIG. 5A, a substrate 502 is provided. An etching stop layer 504 is formed over the substrate 502. A material layer 506 is formed over the etching stop layer 504. The substrate 502 has a first region 11 and a second region 12.

Afterward, as shown in FIG. 5B, the material layer 506 is etched by performing an etching process on the material layer 506 to form a first trench 511 in the first region 11 and a second trench 513 in the second region, in accordance with some embodiments of the disclosure. The first trench 511 has a first top width $W_1$, and the second trench 513 has a second top width $W_2$. The first top width $W_1$ is greater than the second top width $W_2$.

For regions with different exposed areas (or etched areas), it is difficult to control etch uniformity due to the loading effect. Depending on the etching strategy, the loading effect is the etch rate for a high pattern density area being either faster or slower than it is for a low pattern density area. In other words, the loading effect is that the etch rate in a large area is mismatched to the etch rate in a small area. This means that the loading effect may be affected by pattern density.

In order to reduce the loading effect, by applying different first RF powers to the number of first sub-electrodes 112, the regions in the plasma chamber 102 may be controlled to have different plasma density. In some embodiments, the plasma density of the etching gas in the first region 11 is different from the plasma density of the etching gas in the second region 12. That is, although the pattern density in the first region 11 is different from that in the second region 12, the depth of the first trench 511 is substantially equal to the depth of the second trench 513 by separately controlling the first sub-electrodes 112 and the second sub-electrodes 122. In some embodiments, the density of the plasma is affected by the layout and the controller, and the etched depth and the critical dimension (CD) of the etched structure are determined by the density of the plasma. According to feedback of the etched depth, the critical dimension (CD) of the etched structure, the layout and the controller are controlled to obtain desirable etched profile.

Next, as shown in FIG. 5C, a diffusion barrier layer 522 is deposited in the first trench 511 and the second trench 513, and then a conductive layer 524 is formed on the diffusion barrier layer 522, in accordance with some embodiments of the disclosure. As a result, a first conductive structure 526 is constructed by the first diffusion barrier layer 522 and the conductive layer 524 in the first region 11. A second conductive structure 528 is constructed by the diffusion barrier layer 522 and the conductive layer 524 in the second region 12.

The first conductive structure 526 has a first depth $D_1$ which is measured from a top surface of the conductive layer 524 to a bottom surface of the diffusion barrier layer 522. The second conductive structure 528 has a second depth $D_2$ which is measured from a top surface of the conductive layer 524 to a bottom surface of the diffusion barrier layer 522. In some embodiments, a depth ratio ($D_1/D_2$) of the first depth $D_1$ to the second depth $D_2$ is in a range from about 0.8 to about 1.2.

In the first region 11, the first conductive structure 526 has a first top width $W_{T1}$ and a first bottom width $W_{B1}$. In some embodiments, a width ratio ($W_{T1}/W_{B1}$) of the first top width $W_{T1}$ to the first bottom width $W_{B1}$ is in a range from about 0.8 to about 1.2. In the second region 12, the second conductive structure 528 has a second top width $W_{T2}$ and a second bottom width $W_{B2}$. In some embodiments, a width ratio ($W_T/W_B$) of the second top width $W_{T2}$ to the second bottom width $W_{B2}$ is in a range from about 0.8 to about 1.2. A first angle $\theta_1$ is between the bottom surface of the diffusion barrier layer 522 and a sidewall surface of the conductive layer 524. In some embodiments, the first angle $\theta_1$ is in a range from about 70 degrees to about 90 degrees.

Figure 6A:
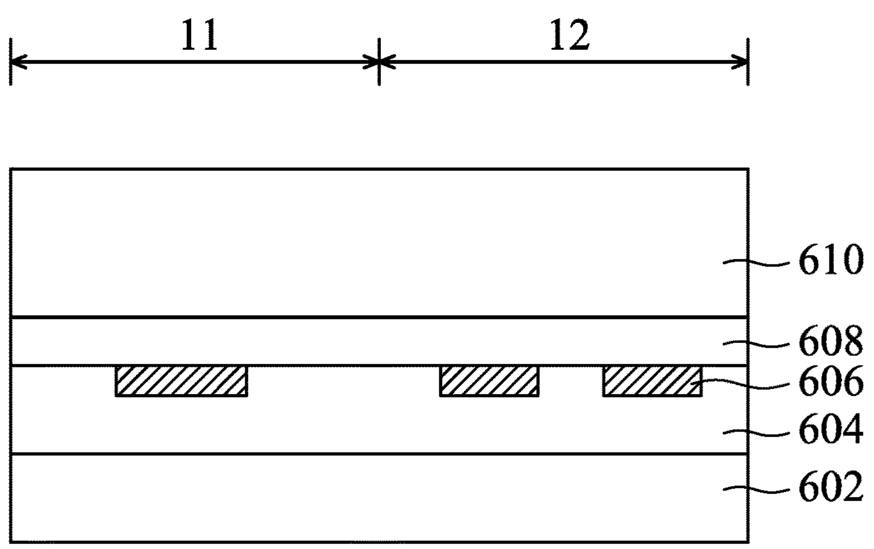
FIGS. 6A-6C show cross-sectional views of various stages of forming a semiconductor device structure, in accordance with some embodiments of the disclosure.
Figure 6B:
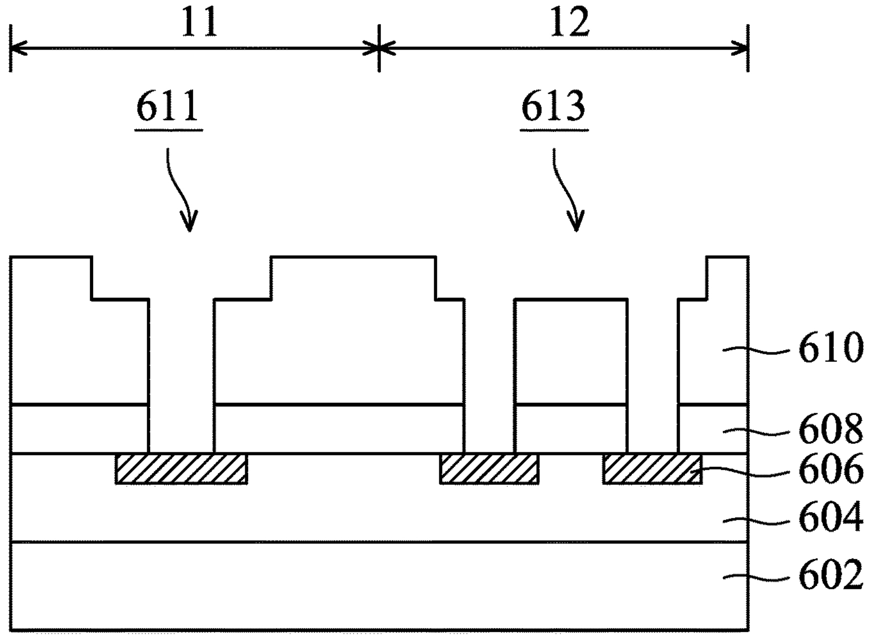
Figure 6C:
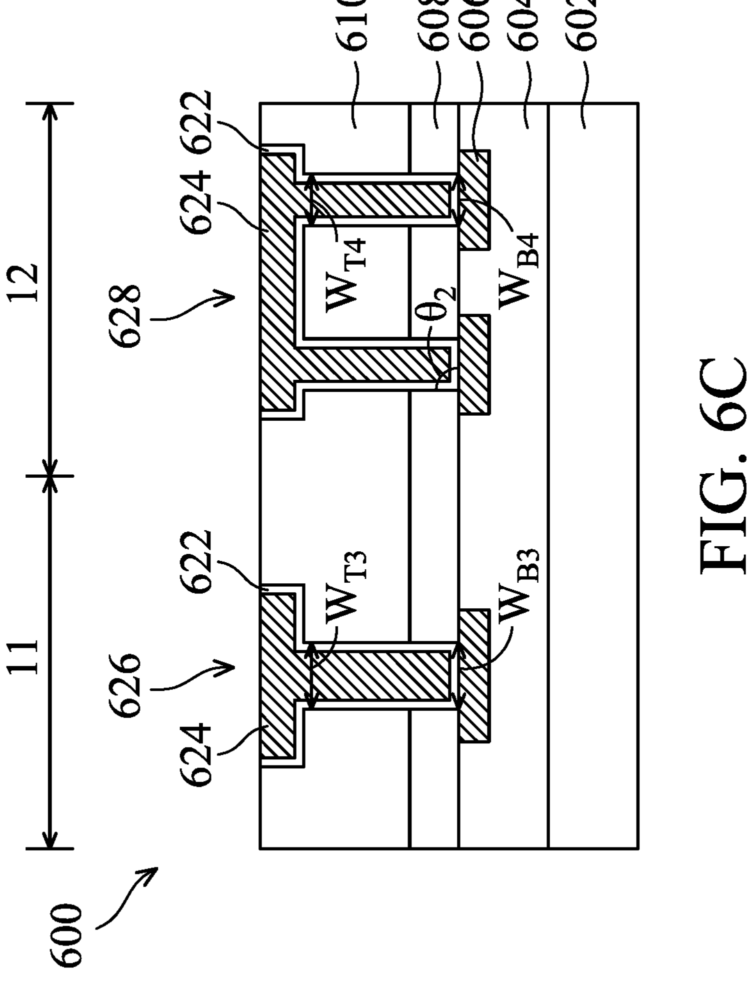

FIGS. 6A-6C show cross-sectional views of various stages of forming a semiconductor device structure 600, in accordance with some embodiments of the disclosure.

As shown in FIG. 6A, a first dielectric layer 604 is formed over a substrate 602, and a conductive layer 606 is formed in the first dielectric layer 604. An etching stop layer 608 is formed over the first dielectric layer 604, and a second dielectric layer 610 is formed over the etching stop layer 608.

Next, as shown in FIG. 6B, a first opening 611 is formed in the first region 11 and a second opening 613 is formed in the second region 12, in accordance with some embodiments of the disclosure. The first opening 611 is a first trench-via cavity for use as a dual damascene cavity. The second opening 613 is a second trench-via cavity for use as a dual damascene cavity.

The first opening 611 and the second opening 613 are formed by performing an etching process. The etching process is performed in the plasma processing apparatus 100 in FIG. 1. It should be noted that although the pattern density in the first region 11 is different from that in the second region 12, and the depth of the first opening 611 is substantially equal to the depth of the second opening 613 by using a number of first sub-electrodes 112 and a number of second sub-electrodes 122. The plasma density in the first region 11 and the second region 12 can be controlled by separately controlling each of the first sub-electrodes 112 and each of the second sub-electrodes 122 via the first matching units 114 and the second matching units 124.

Subsequently, as shown in FIG. 6C, a diffusion barrier layer 622 is deposited in the first opening 611 and the second opening 613, and then a conductive layer 624 is formed on the diffusion barrier layer 622, in accordance with some embodiments of the disclosure. As a result, a first trench-via structure 626 is formed in the first region 11 and a second trench-via structure 628 is formed in the second region 12. The first trench-via structure 626 is electrically connected to the conductive layer 606 in the first region 11, and the second trench-via structure 628 is electrically connected to the conductive layer 606 in the second region 12.

In the first region 11, the first trench-via structure 626 has a third top width $W_{T3}$ and a third bottom width $W_{B3}$. In some embodiments, a width ratio ($W_{T3}/W_{B3}$) of the third top width $W_{T3}$ to the third bottom width $W_{B3}$ is in a range from about 0.8 to about 1.2. In the second region 12, the second trench-via structure 628 has a fourth top width $W_{T4}$ and a fourth bottom width $W_{B4}$. In some embodiments, a width ratio ($W_{T4}/W_{B4}$) of the fourth top width $W_{T4}$ to the fourth bottom width $W_{B4}$ is in a range from about 0.8 to about 1.2. A second angle $\theta_2$ is between the bottom surface of the diffusion barrier layer 622 and a sidewall surface of the conductive layer 624. In some embodiments, the second angle $\theta_2$ is in a range from about 70 degrees to about 90 degrees.

Figure 7A:
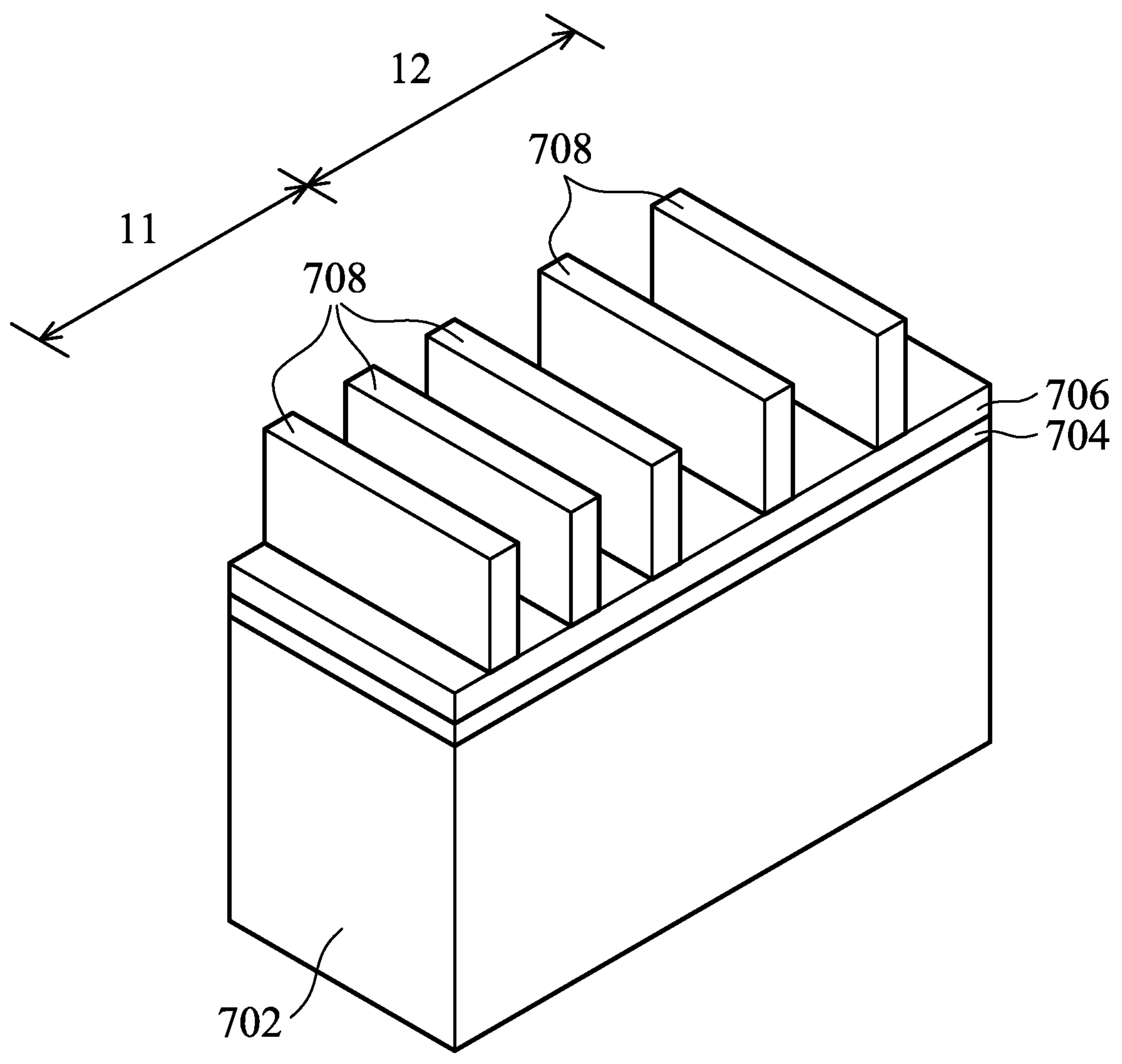
FIGS. 7A-7E show cross-sectional views of various stages of forming a semiconductor device structure, in accordance with some embodiments of the disclosure.
Figure 7B:
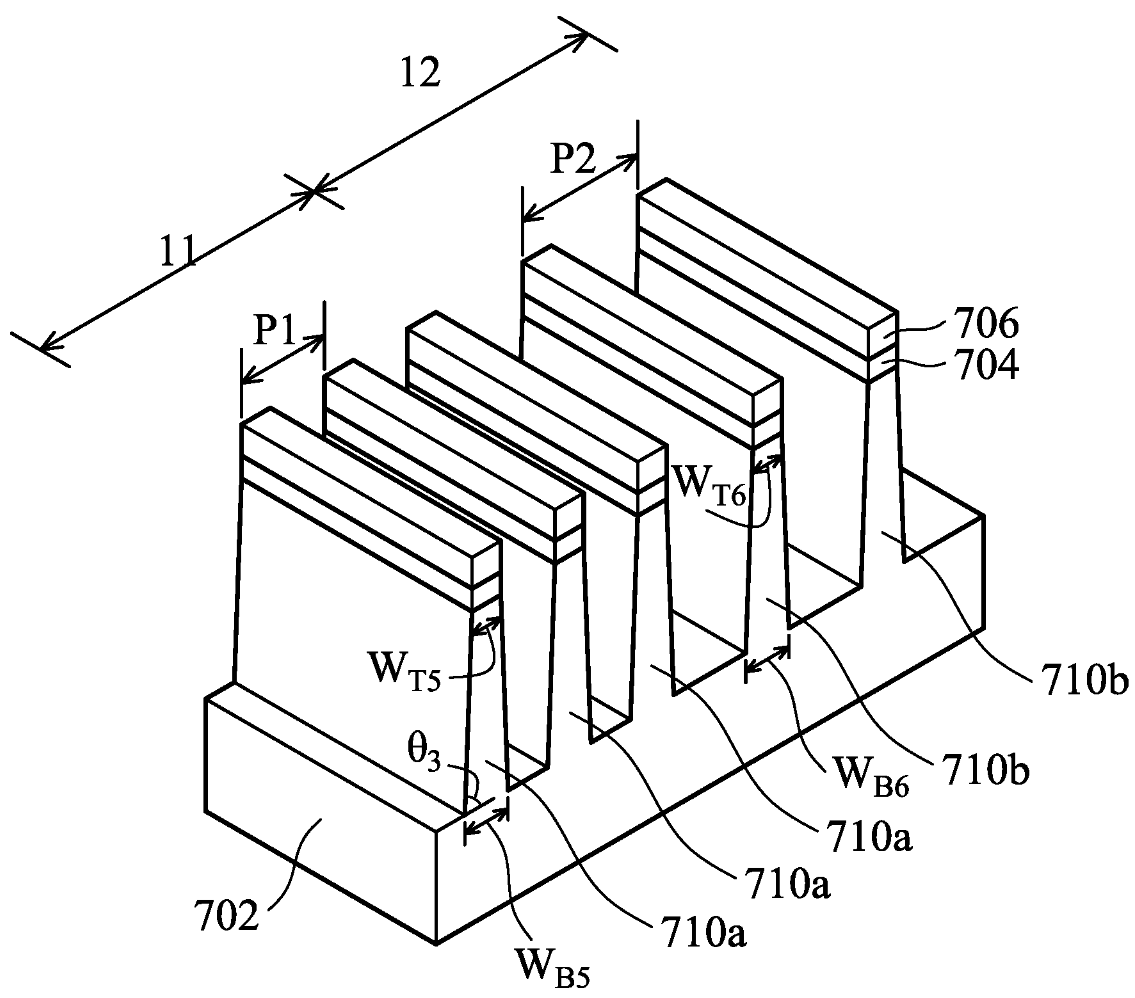
Figure 7C:
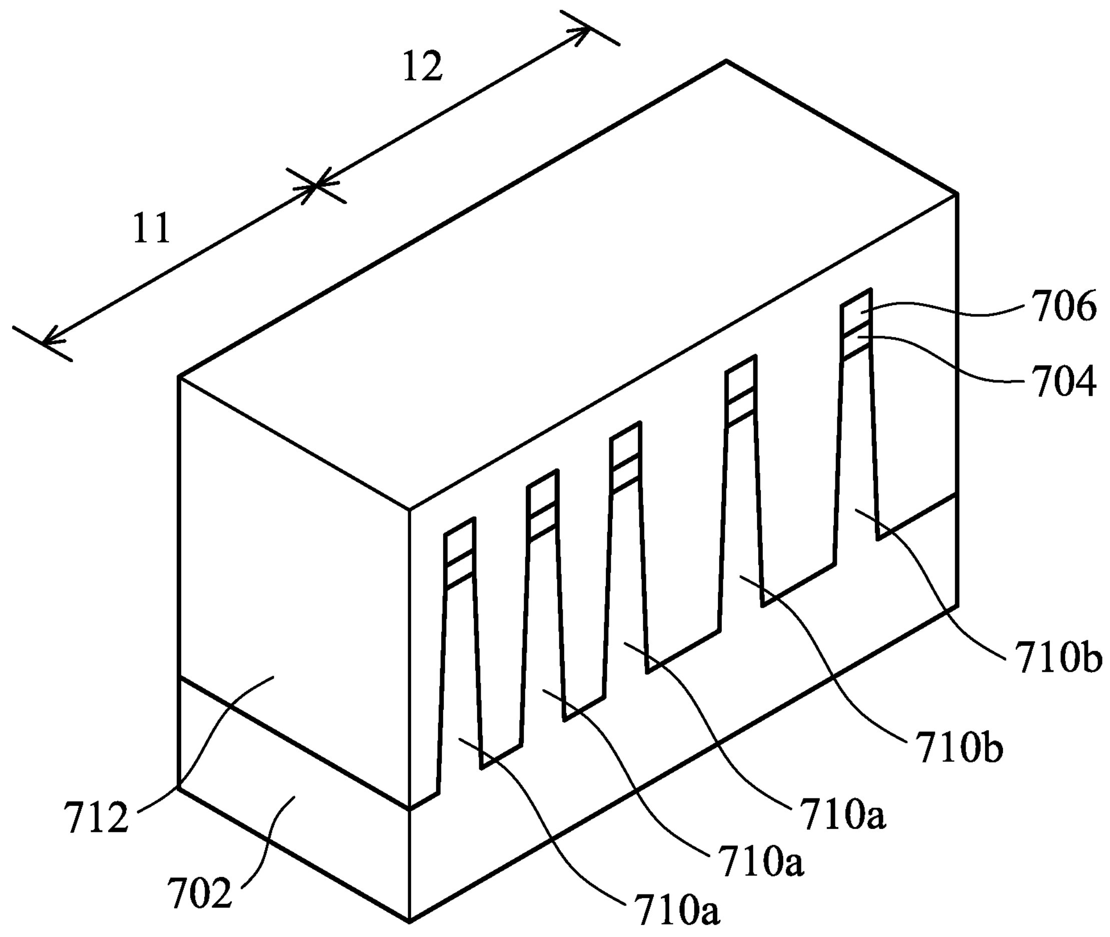

FIGS. 7A-7C show cross-sectional views of various stages of forming a semiconductor device structure 700, in accordance with some embodiments of the disclosure.

As shown in FIG. 7A, a substrate 702 is provided. The substrate 702 includes a first region 11 and a second region 12. Afterwards, a dielectric layer 704 and a mask layer 706 are formed over the substrate 702, and a photoresist layer 708 is formed over the mask layer 706. The photoresist layer 708 is patterned by a patterning process.

Next, as shown in FIG. 7B, after the photoresist layer 708 is patterned, the dielectric layer 704 and the mask layer 706 are patterned by using the patterned photoresist layer 708 as a mask, in accordance with some embodiments. As a result, a patterned dielectric layer 704 and a patterned mask layer 706 are obtained. Afterwards, the patterned photoresist layer 708 is removed.

Afterwards, an etching process is performed on the substrate 702 to form a number of fin structures **710*a*, 710*b* by using the patterned dielectric layer 704 and the patterned mask layer 706 as a mask. The fin structures 710*a*, 710*b* include first fin structures 710*a* in the first region 11 and second fin structures 710*b* in the second region 12. In some embodiments, each of the fin structures 710*a*, 710*b* has a width that gradually increases from the top portion to the bottom portion. In other words, each of the fin structures 710*a*, 710*b* has a tapered fin width which is gradually tapered from the bottom portion to the top portion. A first pitch P1 is between two adjacent fin structures 710*a* in the first region 11, and a second pitch P2 is between two adjacent fin structures 710*b* in the second region 12**. The second pitch P2 is greater than the first pitch P1.

Each of the first fin structures **710*a* has a fifth top width $W_{T5}$ and a fifth bottom width $W_{B5}$. In some embodiments, a width ratio ($W_{T5}/W_{B5}$) of the fifth top width $W_{T5}$ to the fifth bottom width $W_{B5}$ is in a range from about 0.8 to about 1.2. A third angle $\theta_3$ is between the bottom surface of the first fin structure 710*a* and a sidewall surface of the first fin structure 710*a***. In some embodiments, the third angle $\theta_3$ is in a range from about 70 degrees to about 90 degrees.

Afterwards, as shown in FIG. 7C, after the fin structures **710*a*, 710*b* are formed, the isolation layer 712 is formed to cover the fin structures 710*a*, 710*b* over the substrate 702**, in accordance with some embodiments.

Figure 7D:
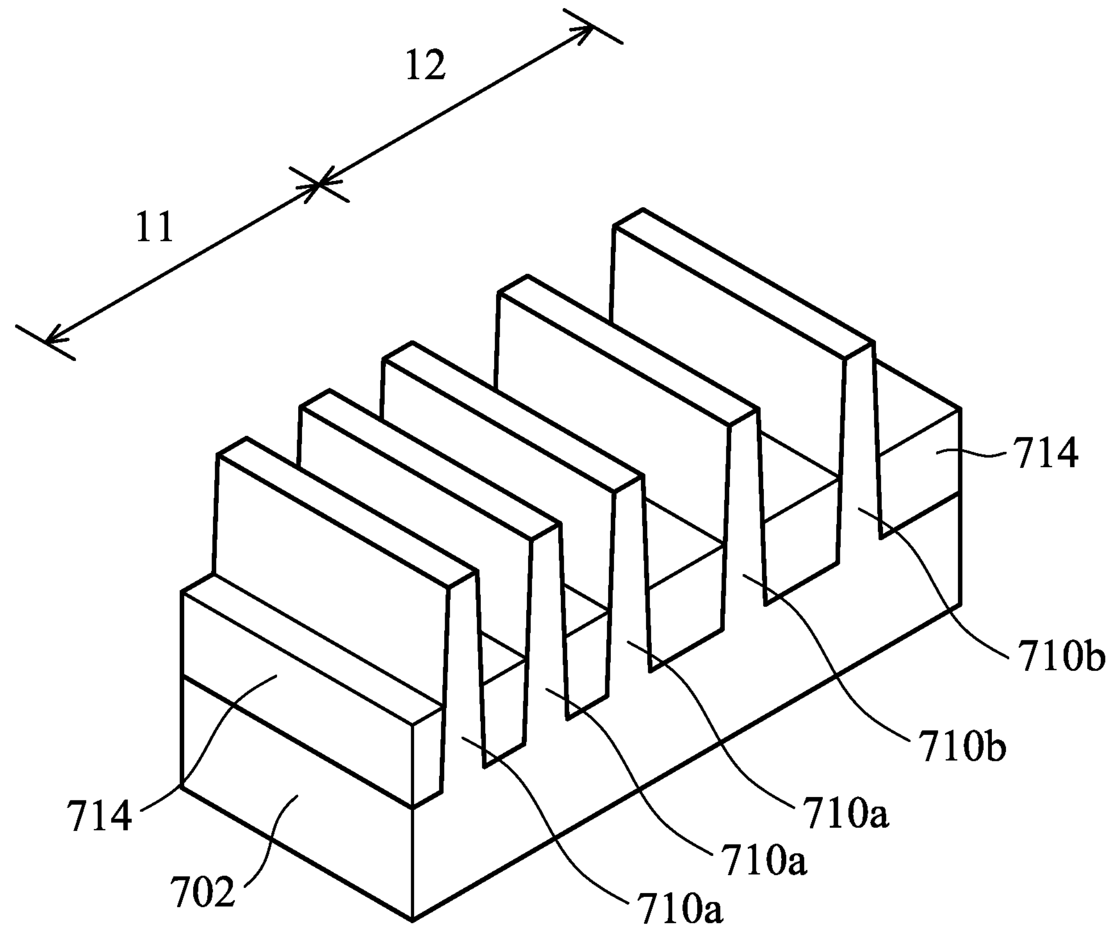

Next, as shown in FIG. 7D, the isolation layer 712 is thinned or planarized to expose the top surface of the patterned mask layer 706. In some embodiments, the insulating layer 712 is thinned by a chemical mechanical polishing (CMP) process. Afterwards, a portion of the insulating layer 712 is removed to form an isolation structure 714, in accordance with some embodiments.

Figure 7E:
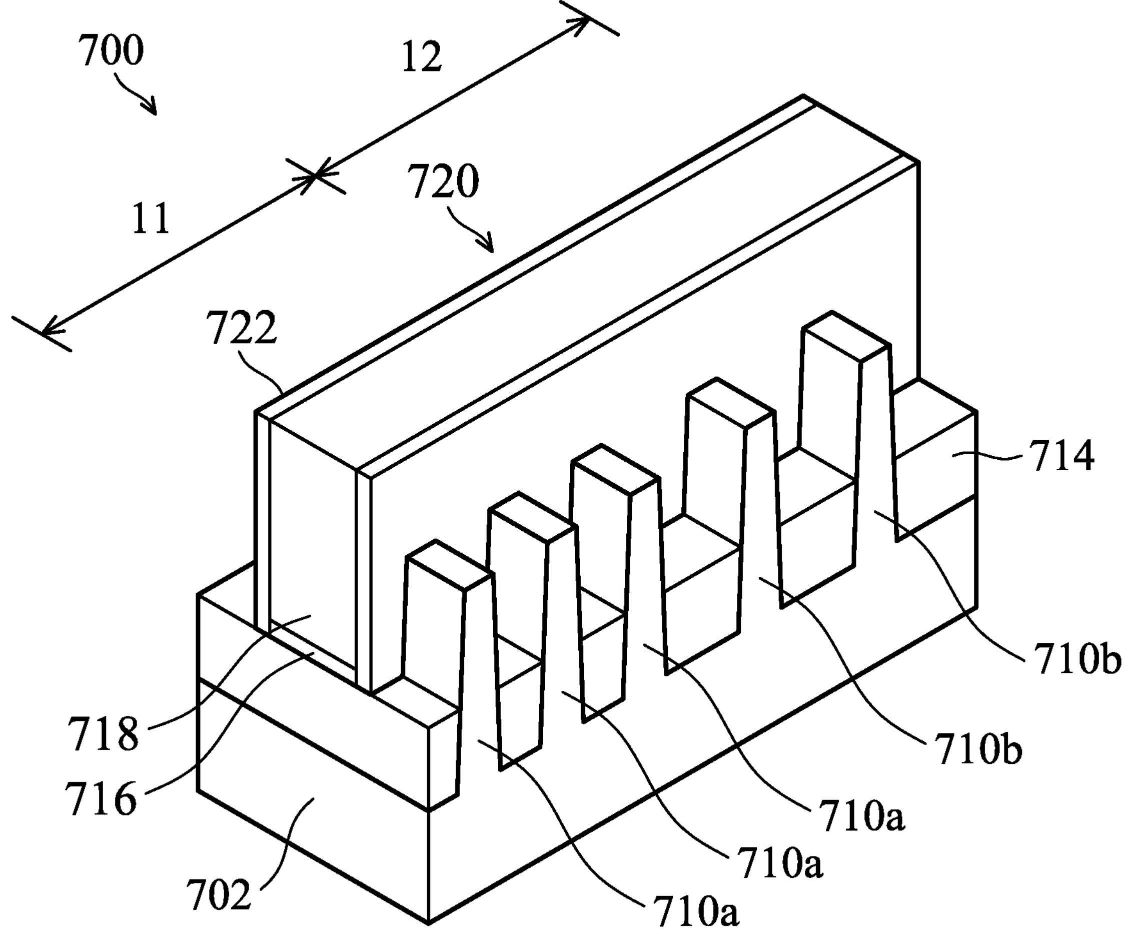

Afterwards, as shown in FIG. 7E, a gate dielectric layer 716 is formed on the fin structures **710*a*, 710*b*, the isolation structures 714*a*, 714*b*, and a gate electrode layer 718 is formed on the gate dielectric layer 716, in accordance with some embodiments. A gate structure 720 is constructed by the gate dielectric layer 716 and the gate electrode layer 718**.

The disclosure provides a plasma processing apparatus. The first RF power source 116 is configured to provide different RF powers to the first sub-electrodes 112 to form a desired plasma density distribution in the plasma chamber 102. In addition, the second RF power source 126 is configured to provide different RF powers to the second sub-electrodes 122 to form a desired plasma density distribution in the plasma chamber 102.

The methods for forming the semiconductor device structures 500, 600, 700 include using the plasma processing apparatus 100. In some embodiments, the substrate 502 with the material layer 506 (as shown in FIG. 5A) is positioned in the plasma chamber 102. A processing gas is supplied into the plasma chamber 102, and then the first RF power source 116 is applied to the first sub-electrodes 112 by the first matching units 114 to form a plasma. The material layer 506 is etched by using the plasma. In some other embodiments, in addition to applying the first RF power source 116 to the first sub-electrodes 112, the second RF power source 126 is simultaneously applied to the second sub-electrodes 122 by the second matching units 124.

The plasma density in the plasma chamber 102 can be controlled by adjusting the first height $H_1$ of each of the first sub-electrodes 112. Furthermore, the cleaning process is performed in-situ after the etching process without transferring the substrate 170 to another chamber. Therefore, the risk of substrate pollution is reduced.

Embodiments for a plasma processing apparatus and method for formation a semiconductor device structure are provided. The plasma processing apparatus includes a plasma chamber including a housing, a first electrode array disposed outside the housing, and a number of first matching units outside the housing. The first electrode array includes a number of first sub-electrodes. The first sub-electrodes may be separately controlled by a number of first matching units. The plasma processing apparatus further includes a wafer support disposed in the plasma chamber. A second electrode array is disposed in the wafer support, and the second electrode array includes a number of second sub-electrodes. The second sub-electrodes may be separately controlled by a number of second matching units.

The first RF power source is configured to provide different RF powers to the first sub-electrodes to form a desired plasma density distribution in the different regions of the plasma chamber. The second RF power source is configured to provide different RF powers to the second sub-electrodes to form a desired plasma density distribution in the different regions of the plasma chamber. As a result, the etched depths or etched widths of the trench in different regions are controlled well by using the first sub-electrodes and the second sub-electrodes. Therefore, the quality and yield of the semiconductor device structure is improved.

In some embodiments, a method for forming a semiconductor device structure is provided. The method includes placing a substrate including a material layer thereon in a plasma chamber. The plasma chamber includes a housing, a first electrode array including a plurality of first sub-electrodes, a plurality of first matching units each electrically connected to one of the plurality of first sub-electrodes, and a second electrode array disposed in the housing, the second electrode array including a plurality of second sub-electrodes. The method also includes supplying an etching gas into the plasma chamber and applying a first RF power source to the plurality of first sub-electrodes of the first electrode array by the plurality of first matching units to form an etching plasma from the etching gas. The method further includes adjusting a distance between each of the plurality of first sub-electrodes and the substrate to generate a plasma density distribution across the substrate and performing an etching process on the material layer using the etching plasma.

In some embodiments, a method for forming a semiconductor device structure is provided. The method includes placing a substrate including a material layer thereon in a plasma chamber. The plasma chamber includes a housing, a first electrode array including a plurality of first sub-electrodes, and a plurality of first matching units each electrically connected to one of the plurality of first sub-electrodes. The method also includes supplying an etching gas into the plasma chamber and applying a first RF power source to the plurality of first sub-electrodes of the first electrode array by the plurality of first matching units to form an etching plasma from the etching gas. The method further includes adjusting a distance between each of the plurality of first sub-electrodes and the substrate to generate a plasma density distribution across the substrate and performing an etching process on the material layer using the etching plasma.

In some embodiments, a method for forming a semiconductor device structure is provided. The method includes placing a substrate in a plasma chamber. The plasma chamber includes a housing, a first electrode array disposed above and outside the housing and including a plurality of first sub-electrodes, a plurality of first matching units disposed above and outside the housing and each electrically connected to one of the plurality of first sub-electrodes, and a plurality of first conductive lines disposed above and outside the housing and connected between the plurality of first sub-electrodes and the plurality of first matching units. The method also includes supplying an etching gas into the plasma chamber and applying a first RF power source to the plurality of first sub-electrodes of the first electrode array by the plurality of first matching units to form an etching plasma from the etching gas. The method further includes adjusting a length of at least one of the plurality of first conductive lines to generate a plasma density distribution across the substrate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a semiconductor device structure, comprising:

placing a substrate comprising a material layer thereon in a plasma chamber, wherein the plasma chamber comprises:

a housing;

a first electrode array disposed outside the housing, comprising a plurality of first sub-electrodes, wherein the plurality of first sub-electrodes comprise:

a first row of the plurality of first sub-electrodes substantially aligned in a first direction;

a second row of the plurality of first sub-electrodes substantially aligned in the first direction; and a third row of the plurality of first sub-electrodes substantially aligned in the first direction, wherein each of the plurality of first sub-electrodes in the first row is substantially aligned with one of the plurality of first sub-electrodes in the second row and one of the plurality of first sub-electrodes in the third row in a second direction being orthogonal to the first direction;

a plurality of first matching units each electrically connected to one of the plurality of first sub-electrodes; and a wafer support disposed in the housing, comprising:

a plurality of gas channels disposed in a top portion of the wafer support; and a second electrode array disposed under the plurality of gas channels within the housing, the second electrode array comprising a plurality of second sub-electrodes, wherein the first electrode array and the second electrode array are each arranged in a matrix having the same number of rows and columns, each of the first sub-electrodes has a circular spiral shape winding around a central region to form multiple turns when seen from a top-view, and each of the second sub-electrodes has a circular shape corresponding to the first electrode array when seen from a top-view, wherein each of the circular spiral shape of each of the plurality of first sub-electrodes is encircled by an insulating material that conforms to the same circular spiral shape, winding around the central region and forming multiple turns;

supplying an etching gas into the plasma chamber;

applying a first RF power source to the plurality of first sub-electrodes of the first electrode array by the plurality of first matching units to form an etching plasma from the etching gas;

adjusting a first distance between a first one of the plurality of first sub-electrodes and the substrate to generate a first plasma density over a first region of the substrate and a second distance between a second one of the plurality of first sub-electrodes and the substrate to generate a second plasma density over a second region of the substrate, wherein the first plasma density is different from the second plasma density; and performing an etching process on the material layer using the etching plasma to form a first trench in the first region of the substrate and a second trench in the second region of the substrate, wherein the first trench etched under the first plasma density and the second trench etched under the second plasma density have different widths and substantially equal depth.

2. The method of claim 1, further comprising:

applying a second RF power source to the plurality of second sub-electrodes of the second electrode array by a plurality of second matching units.

3. The method of claim 1, further comprising controlling an amount of RF power from the first RF power source by switching each of the plurality of first sub-electrodes to connect to ground or to the first RF power source.

4. The method of claim 1, wherein the plurality of first matching units are at an equal level and are connected to the plurality of first sub-electrodes by a plurality of first conductive lines, and adjusting the first distance and the second distance comprises adjusting a first length of a first one of the plurality of first conductive lines and a second length of a second one of the plurality of first conductive lines.

5. The method of claim 1, wherein a distance between a bottom surface of any of the plurality of first sub-electrodes and a top surface of the housing is outside the housing.

6. The method of claim 1, wherein there are three first sub-electrodes in the first row.

7. The method of claim 1, wherein the first region is closer to the housing than the second region, and the first plasma density is higher than the second plasma density.

8. The method of claim 1, further comprising cooling the substrate by a built-in cooling mechanism, wherein the built-in cooling mechanism comprises a cooling plate disposed under the second electrode array within the wafer support and a cooling fluid disposed in the cooling plate.

9. The method of claim 1, wherein the plasma chamber further comprises:

an electrostatic electrode embedded in the wafer support; and a gas supply coupled to the gas channels for transferring heat generated by the electrostatic electrode to provide uniform temperature distribution.

10. The method of claim 9, wherein the electrostatic electrode is sandwiched between the second electrode array and the plurality of gas channels, and the plasma chamber further comprises a chuck power connected to the electrostatic electrode.

11. The method of claim 2, wherein the second sub-electrodes are positioned in closer proximity to the plurality of gas channels, while the second matching units are located at a greater distance from the plurality of gas channels.

12. A method for forming a semiconductor device structure, comprising:

placing a substrate comprising a material layer thereon in a plasma chamber, wherein the plasma chamber comprises:

a housing comprising a gas inlet at a top portion of the housing and a gas outlet at a bottom portion of the housing;

a wafer support;

an electrostatic electrode disposed in the wafer support;

a first gas supply coupled to the wafer support;

a plurality of gas channels disposed in a top portion of the wafer support and connected to the first gas supply for transferring heat generated by the electrostatic electrode to provide uniform temperature distribution;

a first electrode array disposed outside the housing, comprising a plurality of first sub-electrodes arranged in a plurality of rows;

a plurality of first matching units each electrically connected to one of the plurality of first sub-electrodes; and a second electrode array disposed in the housing, the second electrode array comprising a plurality of second sub-electrodes, wherein the first electrode array and the second electrode array are each arranged in a matrix having the same number of rows and columns, each of the first sub-electrodes has a circular spiral shape winding around a central region to form multiple turns when seen from a top-view, and each of the second sub-electrodes has a circular shape corresponding to the first electrode array when seen from a top-view, wherein each of the circular spiral shape of each of the plurality of first sub-electrodes is encircled by an insulating material that conforms to the same circular spiral shape, winding around the central region and forming multiple turns;

supplying an etching gas from a second gas supply that is coupled to the plasma chamber into the plasma chamber through the gas inlet;

applying a first RF power source to the plurality of first sub-electrodes of the first electrode array by the plurality of first matching units to form an etching plasma from the etching gas;

adjusting a first distance between a first one of the plurality of first sub-electrodes and the substrate to generate a first plasma density over a first region of the substrate and a second distance between a second one of the plurality of first sub-electrodes and the substrate to generate a second plasma density over a second region of the substrate, wherein the first plasma density is different from the second plasma density;

performing an etching process on the material layer using the etching plasma to form a first trench in the first region of the substrate and a second trench in the second region of the substrate, wherein the first trench etched under the first plasma density and the second trench etched under the second plasma density have different widths and substantially equal depth; and evacuating chemical byproducts and unwanted reagents from the plasma chamber through the gas outlet.

13. The method of claim 12, further comprising applying a second RF power source to the plurality of second sub-electrodes of the second electrode array by a plurality of second matching units, wherein the plurality of second matching units are disposed in the wafer support.

14. The method of claim 12, wherein applying the first RF power source to the plurality of first sub-electrodes of the first electrode array further comprises applying different first RF power levels to the plurality of first sub-electrodes, wherein the first RF power levels have a high frequency ranging from about 1 MHz to about 100 MHz.

15. A method for forming a semiconductor device structure, comprising:

placing a substrate comprising a material layer thereon in a plasma chamber, wherein the plasma chamber comprises:

a housing comprising a gas inlet;

a wafer support;

an electrostatic electrode disposed in the wafer support;

a first gas supply coupled to the wafer support;

a plurality of gas channels disposed in a top portion of the wafer support and connected to the first gas supply for transferring heat generated by the electrostatic electrode to provide uniform temperature distribution;

a first electrode array disposed outside the housing, comprising a plurality of first sub-electrodes arranged in a plurality of rows;

a plurality of first matching units each electrically connected to one of the plurality of first sub-electrodes; and a second electrode array disposed in the housing, the second electrode array comprising a plurality of second sub-electrodes, wherein the first electrode array and the second electrode array are each arranged in a matrix having the same number of rows and columns, each of the first sub-electrodes has a circular spiral shape winding around a central region to form multiple turns when seen from a top-view, and each of the second sub-electrodes has a circular shape corresponding to the first electrode array when seen from a top-view, wherein each of the circular spiral shape of each of the plurality of first sub-electrodes is encircled by an insulating material that conforms to the same circular spiral shape, winding around the central region and forming multiple turns;

supplying an etching gas from a second gas supply that is coupled to the plasma chamber into the plasma chamber through the gas inlet;

applying a first RF power source to the plurality of first sub-electrodes of the first electrode array by the plurality of first matching units to form an etching plasma from the etching gas;

adjusting a first distance between a first one of the plurality of first sub-electrodes and the substrate to generate a first plasma density over a first region of the substrate and a second distance between a second one of the plurality of first sub-electrodes and the substrate to generate a second plasma density over a second region of the substrate, wherein the first plasma density is different from the second plasma density;

performing an etching process on the material layer using the etching plasma to form a first trench in the first region of the substrate and a second trench in the second region of the substrate, wherein the first trench etched under the first plasma density has a first width and a first depth, the second trench etched under the second plasma density has a second width and a second depth, the first width is different from the second width, and the first depth is substantially equal to the second depth; and performing a cleaning process after the etching process by supplying a cleaning gas from the second gas supply into the plasma chamber through the gas inlet.

16. The method of claim 15, wherein the cleaning process is performed on an edge region of the substrate by applying the first RF power source to a portion of the first sub-electrodes located at an edge region of the first electrode array and configured to increase plasma density near the edge region of the substrate.

17. The method of claim 15, wherein the etching gas supplied by the second gas supply comprises fluorine-containing gas and an oxygen-containing gas, and the cleaning gas supplied by the second gas supply comprises fluorine-containing gas, inert gas, or a combination thereof.

18. The method of claim 1, wherein the circular shape of each of the second sub-electrodes is a formed as a continuous circular conductive structure without a gap.

19. The method of claim 12, wherein a horizontal span of the plurality of first sub-electrodes is greater than a horizontal span of the plurality of second sub-electrodes.

20. The method of claim 15, wherein the etching process is performed until an etching stop layer under the material layer is exposed, such that a bottom of the first trench is level with a bottom of the material layer.

* * * * *